US012733476B2

(12) United States Patent
Yim et al.

(10) Patent No.: US 12,733,476 B2
(45) Date of Patent: Sep. 8, 2026

(54) SEMICONDUCTOR DEVICE AND METHOD OF FABRICATING THE SAME

(71) Applicant: Samsung Electronics Co., Ltd., Suwon-si (KR)

(72) Inventors: Jeonghyuk Yim, Suwon-si (KR); Wandon Kim, Suwon-si (KR); Hyunbae Lee, Suwon-si (KR); Hyoseok Choi, Suwon-si (KR); Sunghwan Kim, Suwon-si (KR); Junki Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 427 days.

(21) Appl. No.: 18/468,317

(22) Filed: Sep. 15, 2023

(65) Prior Publication Data

US 2024/0250000 A1 Jul. 25, 2024

(30) Foreign Application Priority Data

Jan. 25, 2023 (KR) ........................ 10-2023-0009742

(51) Int. Cl.

| | |
|---|---|
| ***H10W 20/20*** | (2026.01) |
| ***H10D 30/43*** | (2025.01) |
| ***H10D 30/67*** | (2025.01) |
| ***H10D 62/10*** | (2025.01) |
| ***H10D 64/66*** | (2025.01) |

(52) U.S. Cl.

CPC ............ *H10W 20/20* (2026.01); *H10D 30/43* (2025.01); *H10D 30/6729* (2025.01); *H10D 30/6735* (2025.01); *H10D 30/6757* (2025.01); *H10D 62/121* (2025.01); *H10D 64/665* (2025.01)

(58) Field of Classification Search

CPC .. H10D 30/506; H10D 30/797; H10D 64/017; H10D 64/258

See application file for complete search history.

(56) References Cited

U.S. PATENT DOCUMENTS

| | | | | |
|---|---|---|---|---|
| 10,586,765 | B2 | 3/2020 | Smith et al. | |
| 10,636,739 | B2 | 4/2020 | Beyne et al. | |
| 11,004,789 | B2 | 5/2021 | Doornbos et al. | |
| 2013/0307120 | A1 | 11/2013 | Bhat et al. | |
| 2020/0013625 | A1 * | 1/2020 | Li ...................... | H10D 64/0112 |

(Continued)

FOREIGN PATENT DOCUMENTS

| | | | |
|---|---|---|---|
| CN | 114256140 | A | 3/2022 |
| CN | 114256142 | A | 3/2022 |
| CN | 114597160 | A | 6/2022 |

*Primary Examiner* — Mounir S Amer

(74) *Attorney, Agent, or Firm* — HARNESS, DICKEY & PIERCE, P.L.C.

(57) ABSTRACT

A semiconductor device may include a substrate including an active pattern, a source/drain pattern on the active pattern, an active contact on the source/drain pattern; a lower power line in the substrate, a lower contact that vertically connects the active contact to the lower power line, a conductive layer between the lower contact and the lower power line, and a power delivery network layer on a bottom surface of the substrate. The conductive layer may include silicon (Si) and a first element. The first element may include a transition metal or a metalloid. A concentration of the first element may decrease in a direction from the lower contact toward the lower power line.

20 Claims, 35 Drawing Sheets

(56) References Cited

U.S. PATENT DOCUMENTS

2020/0328212 A1* 10/2020 Wu ...................... H10D 84/853
2021/0057533 A1* 2/2021 Hwang ................ H10D 64/256
2021/0082750 A1 3/2021 Yu et al.
2021/0217861 A1* 7/2021 Song .................... H10D 64/258
2021/0399099 A1 12/2021 Chu et al.
2022/0020666 A1 1/2022 Van Dal et al.
2022/0181197 A1 6/2022 Tao
2022/0293599 A1* 9/2022 Chiu .................... H10D 84/853
2022/0336330 A1 10/2022 Kim et al.
2022/0367353 A1 11/2022 You et al.
2023/0068359 A1* 3/2023 Chang .................. H10D 84/853
2023/0095830 A1* 3/2023 Kim ................... H10D 30/6735
257/288
2024/0172409 A1* 5/2024 Pao ...................... H10B 10/125

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2023-0009742 filed on Jan. 25, 2023 in the Korean Intellectual Property Office, the disclosure of which is hereby incorporated by reference in its entirety.

BACKGROUND

Inventive concepts relate to a semiconductor device and a method of fabricating the same, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some embodiments of inventive concepts provide a semiconductor device having improved electrical properties and increased reliability.

Some embodiments of inventive concepts provide a method of fabricating a semiconductor device having improved electrical properties and increased reliability.

According to some embodiments of inventive concepts, a semiconductor device may include a substrate including an active pattern; a source/drain pattern on the active pattern; an active contact on the source/drain pattern; a lower power line in the substrate; a lower contact that vertically connects the active contact to the lower power line; a conductive layer between the lower contact and the lower power line; and a power delivery network layer on a bottom surface of the substrate. The conductive layer may include silicon (Si) and a first element. The first element may include a transition metal or a metalloid. A concentration of the first element may decrease in a direction from the lower contact toward the lower power line.

According to some embodiments of inventive concepts, a semiconductor device may include a substrate including an active pattern; a source/drain pattern on the active pattern; an active contact on the source/drain pattern; a lower power line in the substrate; a lower contact that vertically connects the active contact to the lower power line; a conductive layer between the lower contact and the lower power line; and a power delivery network layer on a bottom surface of the substrate. The conductive layer may include silicon (Si) and a first element. The first element may include a transition metal or a metalloid. A bottom surface of the lower contact may be covered with the conductive layer. A first lower sidewall of the lower contact may be covered with the lower power line.

According to some embodiments of inventive concepts, a semiconductor device may include a substrate including an active pattern; a device isolation layer on the substrate, the device isolation layer defining the active pattern; a channel pattern and a source/drain pattern on the active pattern; a gate electrode on the channel pattern; a gate dielectric layer between the gate electrode and the channel pattern; a gate spacer on a sidewall of the gate electrode; a gate capping pattern on a top surface of the gate electrode; an interlayer dielectric layer that on the source/drain pattern and the gate capping pattern; an active contact penetrating the interlayer dielectric layer, the active contact being electrically connected to the source/drain pattern; a metal-semiconductor compound layer between the active contact and the source/drain pattern; a gate contact penetrating the interlayer dielectric layer and the gate capping pattern, the gate contact being electrically connected to the gate electrode; a first metal layer on the interlayer dielectric layer, the first metal layer including a wiring line that is electrically connected to the gate contact; a lower power line in the substrate; a lower contact penetrating the device isolation layer and extending into the substrate, the lower contact vertically connecting the active contact to the lower power line; and a power delivery network layer on a bottom surface of the substrate. The lower power line may include a body part and a connection part. The connection part may be connected to the lower contact. The connection part may surround a first lower sidewall of the lower contact.

DETAILED DESCRIPTION

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
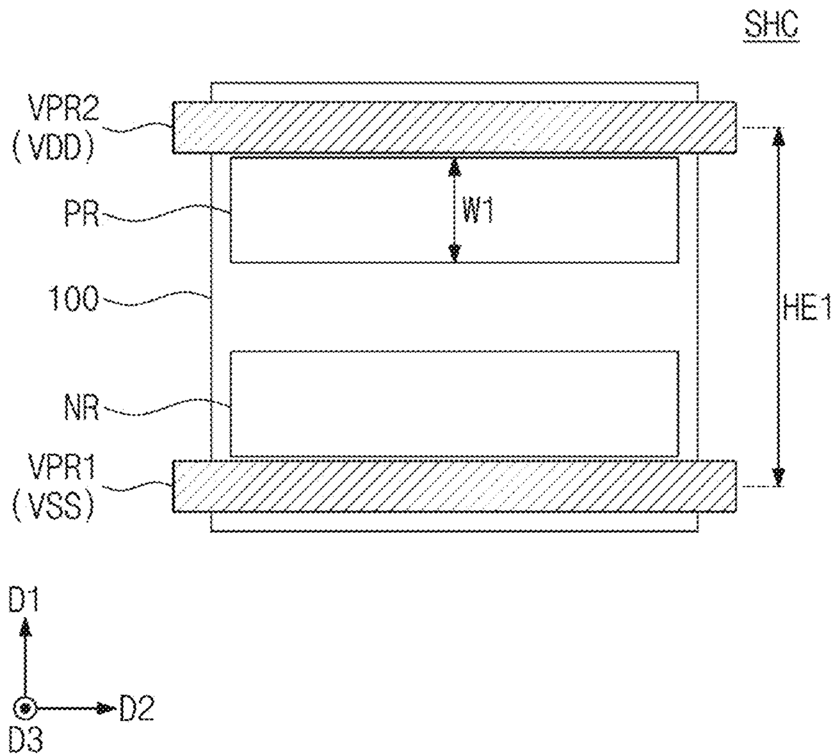
FIGS. 1 to 3 illustrate conceptual views showing logic cells of a semiconductor device according to some embodiments of inventive concepts.
Figure 2:
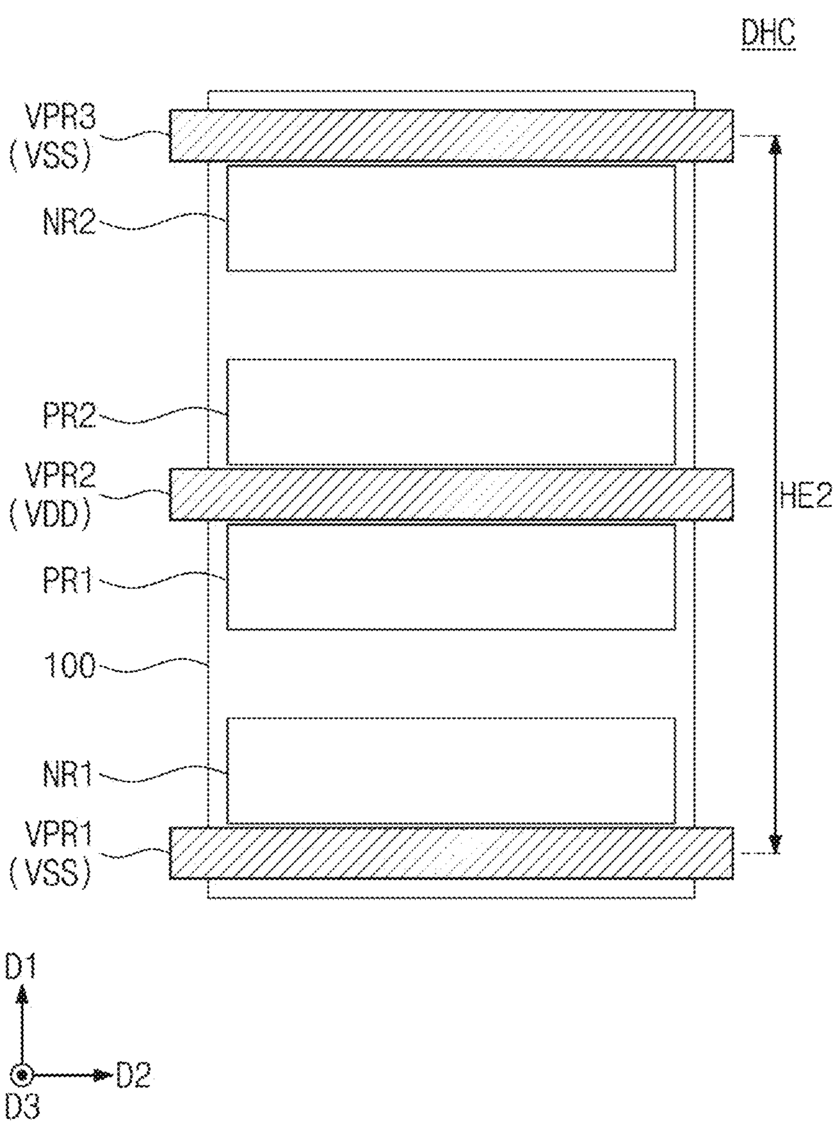
Figure 3:
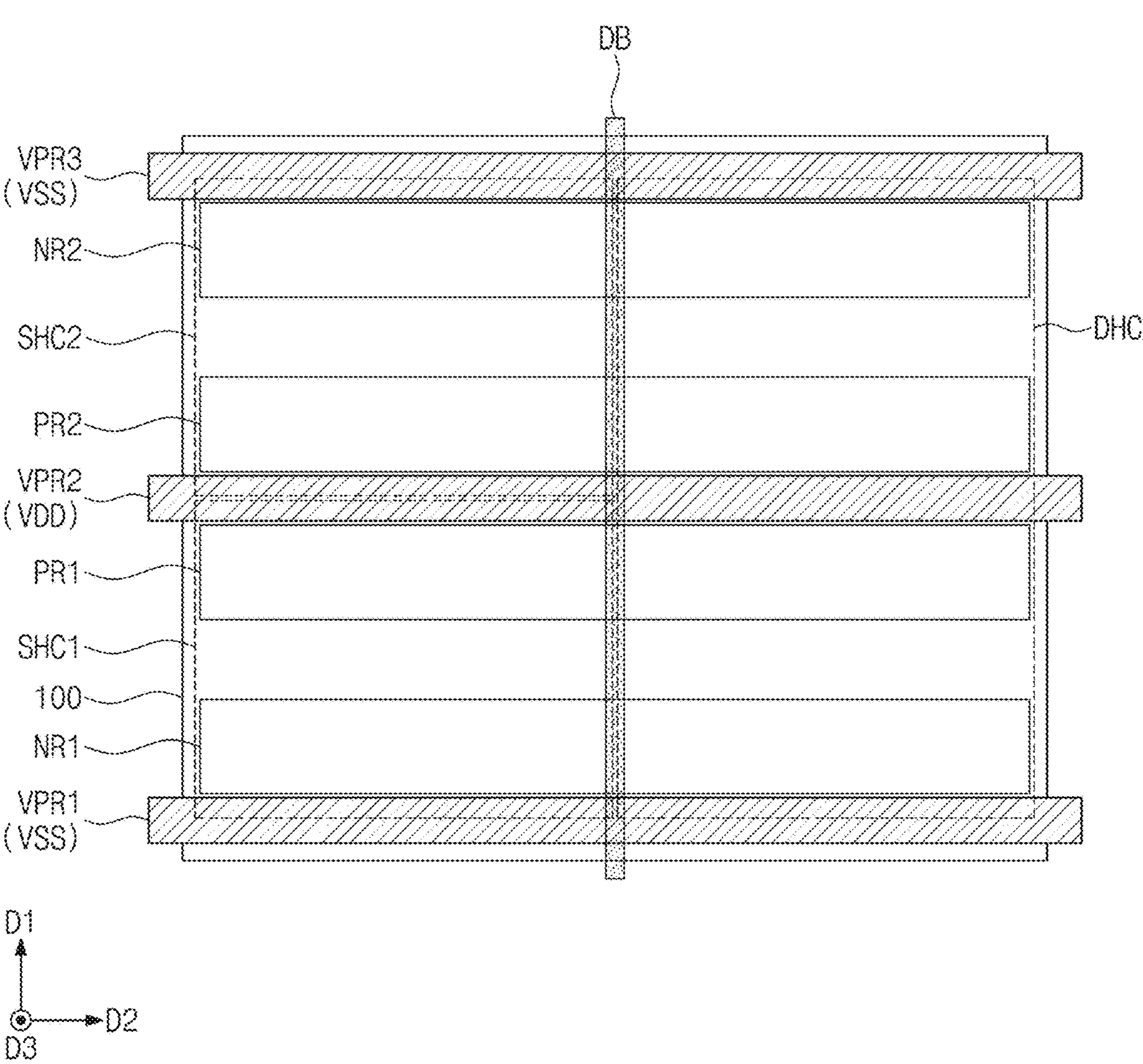

FIGS. 1 to 3 illustrate conceptual views showing logic cells of a semiconductor device according to some embodiments of inventive concepts.

Referring to FIG. 1, a single height cell SHC may be provided. For example, a first lower power line VPR1 and a second lower power line VPR2 may be provided on a lower portion of a substrate 100. The first lower power line VPR1 may be a path for providing a source voltage VSS, for example, a ground voltage. The second lower power line VPR2 may be a path for providing a drain voltage VDD, for example, a power voltage.

The single height cell SHC may be defined between the first lower power line VPR1 and the second lower power line VPR2. The single height cell SHC may include one PMOSFET region PR and one NMOSFET region NR. For example, the single height cell SHC may have a CMOS structure provided between the first lower power line VPR1 and the second lower power line VPR2.

The PMOSFET region PR and the NMOSFET region NR may each have a first width W1 in a first direction D1. A first height HE1 may be defined to indicate a length in the first direction D1 of the single height cell SHC. The first height HE1 may be substantially the same as a distance (e.g., pitch) between the first lower power line VPR1 and the second lower power line VPR2.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first lower power line VPR1, a second lower power line VPR2, and a third lower power line VPR3. The second lower power line VPR2 may be disposed between the first lower power line VPR1 and the third lower power line VPR3. The third lower power line VPR3 may be a path for providing a source voltage VSS.

The double height cell DHC may be defined between the first lower power line VPR1 and the third lower power line VPR3. The double height cell DHC may include a first PMOSFET region PR1, a second PMOSFET region PR2, a first NMOSFET region NR1, and a second NMOSFET region NR2.

The first NMOSFET region NR1 may be adjacent to the first lower power line VPR1. The second NMOSFET region NR2 may be adjacent to the third lower power line VPR3. The first and second PMOSFET regions PR1 and PR2 may be adjacent to the second lower power line VPR2. When viewed in plan, the second lower power line VPR2 may be disposed between the first and second PMOSFET regions PR1 and PR2.

A second height HE2 may be defined to indicate a length in the first direction D1 of the double height cell DHC. The second height HE2 may be about twice the first height HE1 of FIG. 1. The first and second PMOSFET regions PR1 and PR2 of the double height cell DHC may collectively operate as a single PMOSFET region. Therefore, the double height cell DHC may have a PMOS transistor whose channel size is greater than that of a PMOS transistor included in the single height cell SHC discussed above in FIG. 1.

For example, the channel size of the PMOS transistor included in the double height cell DHC may be about twice that of the PMOS transistor included in the single height cell SHC. In conclusion, the double height cell DHC may operate at a higher speed than that of the single height cell SHC. The double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be disposed between a first lower power line VPR1 and a second lower power line VPR2. The second single height cell SHC2 may be disposed between the second lower power line VPR2 and a third lower power line VPR3. The second single height cell SHC2 may be adjacent in a first direction D1 to the first single height cell SHC1.

The double height cell DHC may be located between the first lower power line VPR1 and a third lower power line VPR3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
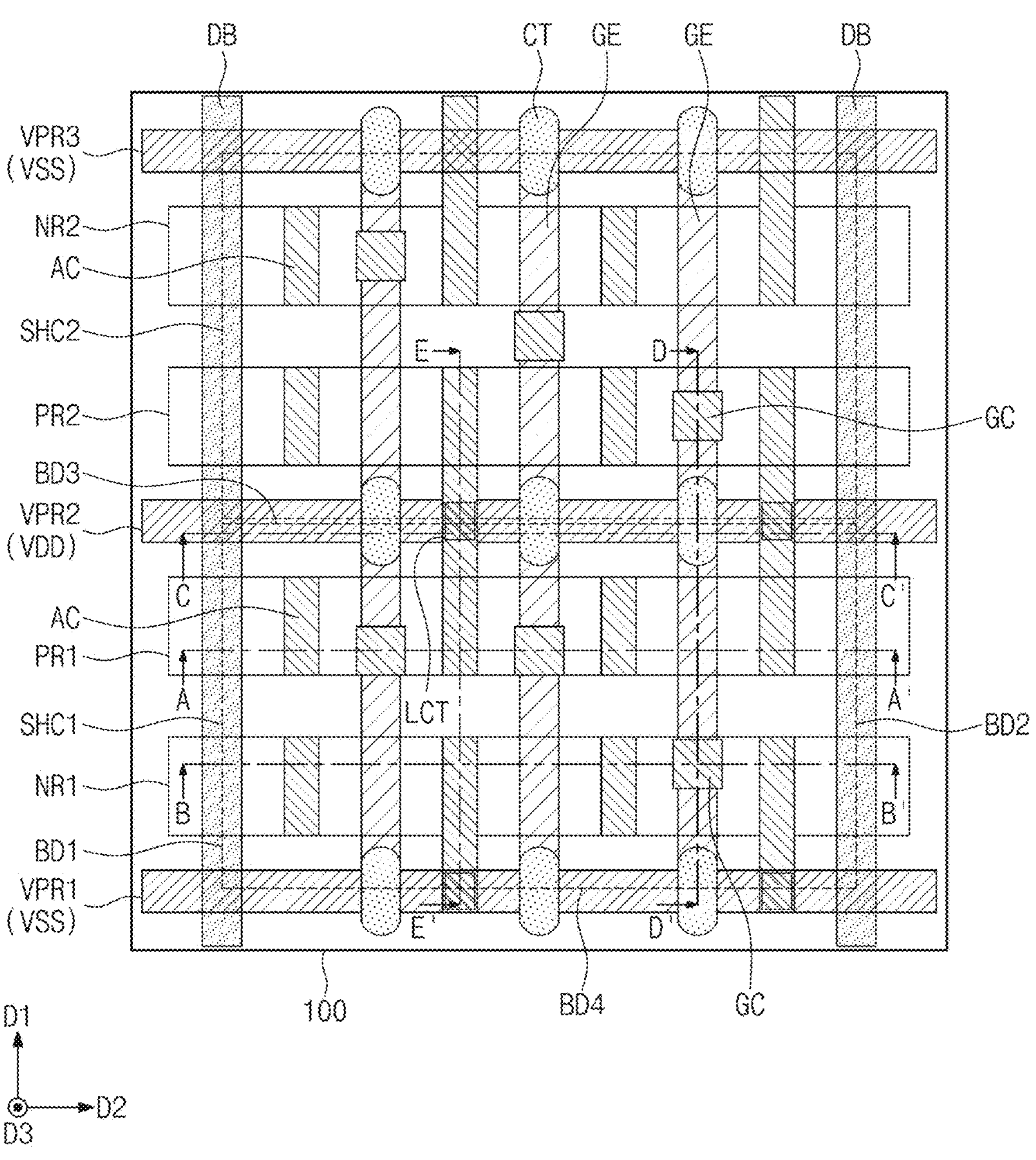
FIG. 4 illustrates a plan view showing a semiconductor device according to some embodiments of inventive concepts.

FIG. 4 illustrates a plan view showing a semiconductor device according to some embodiments of inventive concepts. FIGS. 5A, 5B, 5C, 5D, and 5E illustrate cross-sectional views respectively taken along lines A-A', B-B', C-C', D-D', and E-E' of FIG. 4. FIG. 6 illustrates an enlarged cross-sectional view showing section M of FIG. 5D. A semiconductor device shown in FIGS. 4 and 5A to 5E may be a detailed example of the first and second single height cells SHC1 and SHC2 of FIG. 3.

Referring to FIGS. 4 and 5A to 5E, first and second single height cells SHC1 and SHC2 may be provided on a substrate 100. Each of the first and second single height cells SHC1 and SHC2 may include logic transistors included in a logic circuit. The substrate 100 may be a compound semiconductor substrate or a semiconductor substrate including silicon, germanium, or silicon-germanium. For example, the substrate 100 may be a silicon substrate.

In some embodiments of inventive concepts, the substrate 100 may include a silicon-based dielectric layer. For example, the substrate 100 may include a silicon oxide layer, a silicon nitride layer, or a silicon oxynitride layer. The substrate 100 may be provided in its dielectric layer with lower power lines VPR1 to VPR3 which will be discussed below.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in a second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR formed on an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be vertically protruding portions of the substrate 100.

The trench TR may be filled with a device isolation layer ST. The device isolation layer ST may include a silicon oxide layer. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (or a third direction D3).

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon. Each of the first, second, and third semiconductor patterns SP1, SP2, and SP3 may be a nano-sheet.

A plurality of first source/drain patterns SD1 may be provided on the first active pattern AP1. A plurality of first recesses RS1 may be formed on an upper portion of the first active pattern AP1. The first source/drain patterns SD1 may be correspondingly provided in the first recesses may be1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RS2 may be formed on an upper portion of the second active pattern AP2. The second source/drain patterns SD2 may be correspondingly provided in the second recesses RS2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth (SEG) process. For example, each of the first and second source/drain patterns SD1 and SD2 may have a top surface located at a level substantially the same as that of a top surface of the third semiconductor pattern SP3. For another example, each of the first and second source/drain patterns SD1 and SD2 may have a top surface located at a higher level than that of a top surface of the third semiconductor pattern SP3.

The first source/drain patterns SD1 may include a semiconductor element (e.g., SiGe) whose lattice constant is greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Each of the first source/drain patterns SD1 may include a buffer layer BFL and a main layer MAL on the buffer layer BFL. Referring back to FIG. 5A, the buffer layer BFL may cover an inner wall of the first recess RS1. The buffer layer BFL may occupy a portion of the first recess RS1, and the main layer MAL may fill an unoccupied portion of the first recess RS1. The main layer MAL may have a volume greater than that of the buffer layer BFL.

Each of the buffer layer BFL and the main layer MAL may include silicon-germanium (SiGe). For example, the buffer layer BFL may contain germanium whose concentration is relatively low. In another example of inventive concepts, the buffer layer BFL may not include germanium (Ge), but include only silicon (Si). The germanium concentration of the buffer layer BFL may range from about 0 at % to about 30 at %.

The main layer MAL may contain germanium (Ge) whose concentration is relatively high. For example, the germanium concentration of the main layer MAL may range from about 30 at % to about 70 at %. The germanium concentration of the main layer MAL may increase in the third direction D3. For example, the main layer MAL adjacent to the buffer layer BFL may have a germanium concentration of about 40 at %, and an upper portion of the main layer MAL may have a germanium concentration of about 60 at %.

Each of the buffer layer BFL and the main layer MAL may include impurities (e.g., boron, gallium, or indium) that cause the first source/drain pattern SD1 to have a p-type conductivity. Each of the buffer layer BFL and the main layer MAL may have an impurity concentration of about 1E18 atoms/$cm^3$ to about 5E22 atoms/$cm^3$. The impurity concentration of the main layer MAL may be greater than that of the buffer layer BFL.

The buffer layer BFL may limit and/or prevent stacking faults between the main layer MAL and the substrate 100 (or the first active pattern AP1) and between the main layer MAL and the first, second, and third semiconductor patterns SP1, SP2, and SP3. The occurrence of stacking faults may increase a channel resistance.

The buffer layer BFL may protect the main layer MAL while second semiconductor layers SAL are replaced with first, second, and third inner electrodes PO1, PO2, and PO3 of a gate electrode GE which will be discussed below. For example, the buffer layer BFL may limit and/or prevent the main layer MAL from being etched with an etching material that removes the second semiconductor layers SAL.

Each of the second source/drain patterns SD2 may include silicon (Si). The second source/drain pattern SD2 may further include impurities (e.g., phosphorus, arsenic, or antimony) that cause the second source/drain pattern SD2 to have an n-type conductivity. The second source/drain pattern SD2 may have an impurity concentration of about 1E18 atoms/$cm^3$ to about 5E22 atoms/$cm^3$.

Gate electrodes GE may be provided to extend in a first direction D1, while running across the first and second channel patterns CH1 and CH2. The gate electrodes GE may be arranged at a first pitch in the second direction D2. Each of the gate electrodes GE may vertically overlap the first and second channel patterns CH1 and CH2.

The gate electrode GE may include a first inner electrode PO1 interposed between the first semiconductor pattern SP1 and the active pattern AP1 or AP2, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3.

Referring back to FIG. 5E, the gate electrode GE may be provided on a top surface TS, a bottom surface BS, and opposite sidewalls SW of each of the first, second, and third semiconductor patterns SP1, SP2, and SP3. For example, a transistor according to the present embodiment may be a three-dimensional field effect transistor (e.g., MBCFET or GAAFET) in which the gate electrode GE three-dimensionally surrounds the first and second channel patterns CH1 and CH2.

For example, the first single height cell SHC1 may have a first boundary BD1 and a second boundary BD2 that are opposite to each other in the second direction D2. The first and second boundaries BD1 and BD2 may extend in the first direction D1. The first single height cell SHC1 may have a third boundary BD3 and a fourth boundary BD4 that are opposite to each other in the first direction D1. The third and fourth boundaries BD3 and BD4 may extend in the second direction D2.

Gate cutting patterns CT may be located on a boundary in the second direction D2 of each of the first and second single height cells SHC1 and SHC2. For example, the gate cutting patterns CT may be located on the third and fourth boundaries BD3 and BD4 of the first single height cell SHC1. The gate cutting patterns CT may be arranged at the first pitch along the third boundary BD3. The gate cutting patterns CT may be arranged at the first pitch along the fourth boundary BD4. When viewed in plan, the gate cutting patterns CT on the third and fourth boundaries BD3 and BD4 may be located to correspondingly overlap the gate electrodes GE. The gate cutting patterns CT may include a dielectric material, such as a silicon oxide layer, a silicon nitride layer, or a combination thereof.

The gate cutting pattern CT may separate the gate electrode GE on the first single height cell SHC1 from the gate electrode GE on the second single height cell SHC2. The gate cutting pattern CT may be interposed between the gate electrode GE on the first single height cell SHC1 and the gate electrode GE on the second single height cell SHC2, which gate electrodes GE are aligned with each other in the first direction D1. For example, the gate cutting patterns CT may divide the gate electrode GE, which extends in the first direction D1, into a plurality of gate electrodes GE.

Referring back to FIGS. 4 and 5A to 5E, a pair of gate spacers GS may be disposed on opposite sidewalls of the outer electrode PO4 included in the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. The gate spacers GS may include at least one selected from SiCN, SiCON, and SiN. Alternatively, the gate spacers GS may each include a multiple layer formed of at least two selected from SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover a top surface of the device isolation layer ST that underlies the gate electrode GE.

In an embodiment of inventive concepts, the gate dielectric layer GI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third inner electrodes PO1, PO2, and PO3 of the gate electrode GE may be formed of the first metal pattern or the work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon I. The first metal pattern may include a plurality of stacked work-function metal layers.

The second metal pattern may include a metal whose resistance is less than that of the first metal pattern. For example, the second metal pattern may include at least one metal selected from tungsten (W), aluminum (Al), titanium (Ti), and tantalum (Ta). For example, the outer electrode PO4 of the gate electrode GE may include a first metal pattern and a second metal pattern on the first metal pattern.

Referring back to FIG. 5B, inner spacers IP may be provided on the first and second NMOSFET regions NR1 and NR2. For example, the inner spacers IP may be provided on the second active pattern AP2. The inner spacers IP may be correspondingly interposed between the second source/drain pattern SD2 and the first, second, and third inner electrodes PO1, PO2, and PO3 of the gate electrode GE. The inner spacers IP may be in direct contact with the second source/drain pattern SD2. The inner spacer IP may separate the second source/drain pattern SD2 from each of the first, second, and third inner electrodes PO1, PO2, and PO3 of the gate electrode GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Each of the first and second single height cells SHC1 and SHC2 may be provided on its opposite sides with a pair of separation structures DB that are opposite to each other in the second direction D2. For example, the pair of separation structures DB may be correspondingly provided on first and second boundaries BD1 and BD2 of the first single height cell SHC1. The separation structure DB may extend in the first direction D1 parallel to the gate electrodes GE. A pitch between the separation structure DB and its adjacent gate electrode GE may be the same as the first pitch.

The separation structure DB may penetrate the gate capping pattern GP and the gate electrode GE to extend into the first and second active patterns AP1 and AP2. The separation structure DB may penetrate an upper portion of each of the first and second active patterns AP1 and AP2. The separation structure DB may electrically separate an active region of each of the first and second single height cells SHC1 and SHC2 from an active region of another cell.

Active contacts AC may be provided to penetrate the first and second interlayer dielectric layers 110 and 120 to come into electrical connection with the first and second source/drain patterns SD1 and SD2. A pair of active contacts AC may be correspondingly provided on opposite sides of the gate electrode GE. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one selected from titanium silicide, tantalum silicide, tungsten silicide, nickel silicide, and cobalt silicide.

Gate contacts GC may be provided to penetrate the second interlayer dielectric layer 120 and the gate capping pattern GP to come into electrical connection with the gate electrodes GE. When viewed in plan, two gate contacts GC on the first single height cell SHC1 may be located to overlap the first PMOSFET region PR1. For example, two gate contacts GC on the first single height cell SHC1 may be provided on the first active pattern AP1 (see FIG. 5A).

When viewed in plan, one gate contact GC on the first single height cell SHC1 may be located to overlap the first NMOSFET region NR1. For example, one gate contact GC on the first single height cell SHC1 may be provided on the second active pattern AP2 (see FIG. 5B).

The gate contact GC may be freely located with no limitation of position on the gate electrode GE. For example, the gate contacts GC on the second single height cell SHC2 may be correspondingly located on the second PMOSFET region PR2, the second NMOSFET region NR2, and the device isolation layer ST that fills the trench TR (see FIG. 4).

Figure 5A:
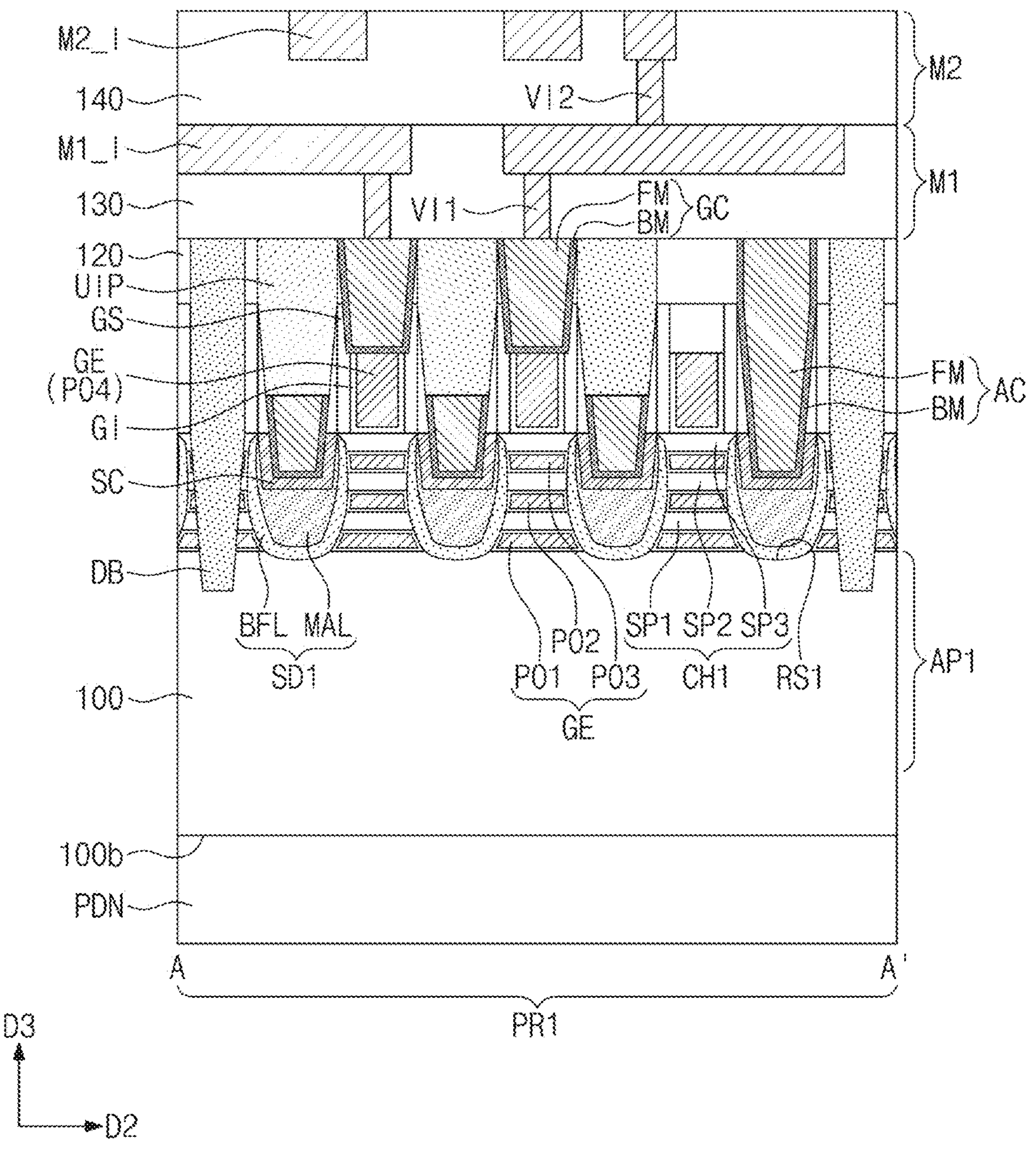
FIGS. 5A, 5B, 5C, 5D, and 5E illustrate cross-sectional views respectively taken along lines A-A', B-B', C-C', D-D', and E-E' of FIG. 4.
Figure 5B:
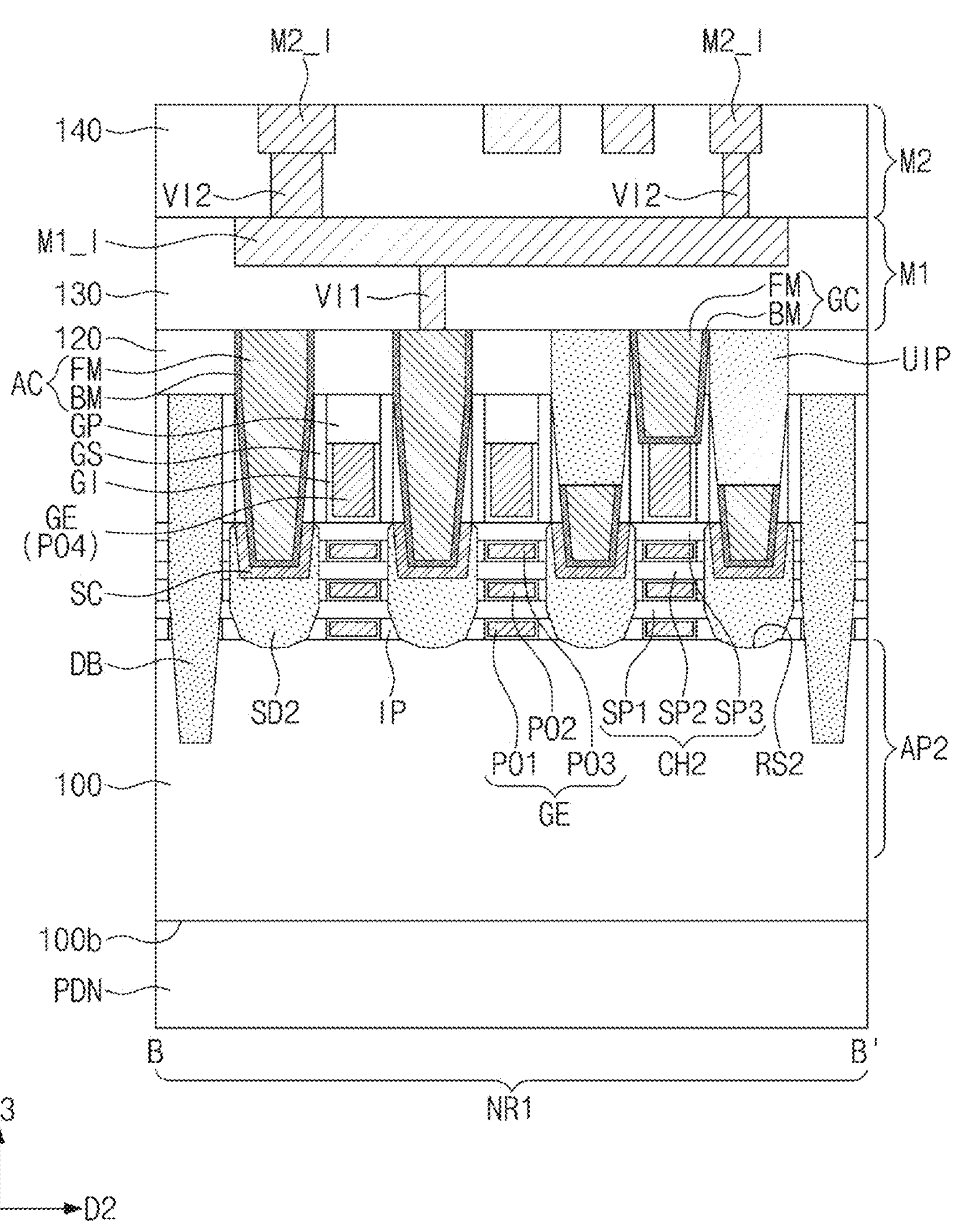
Figure 5C:
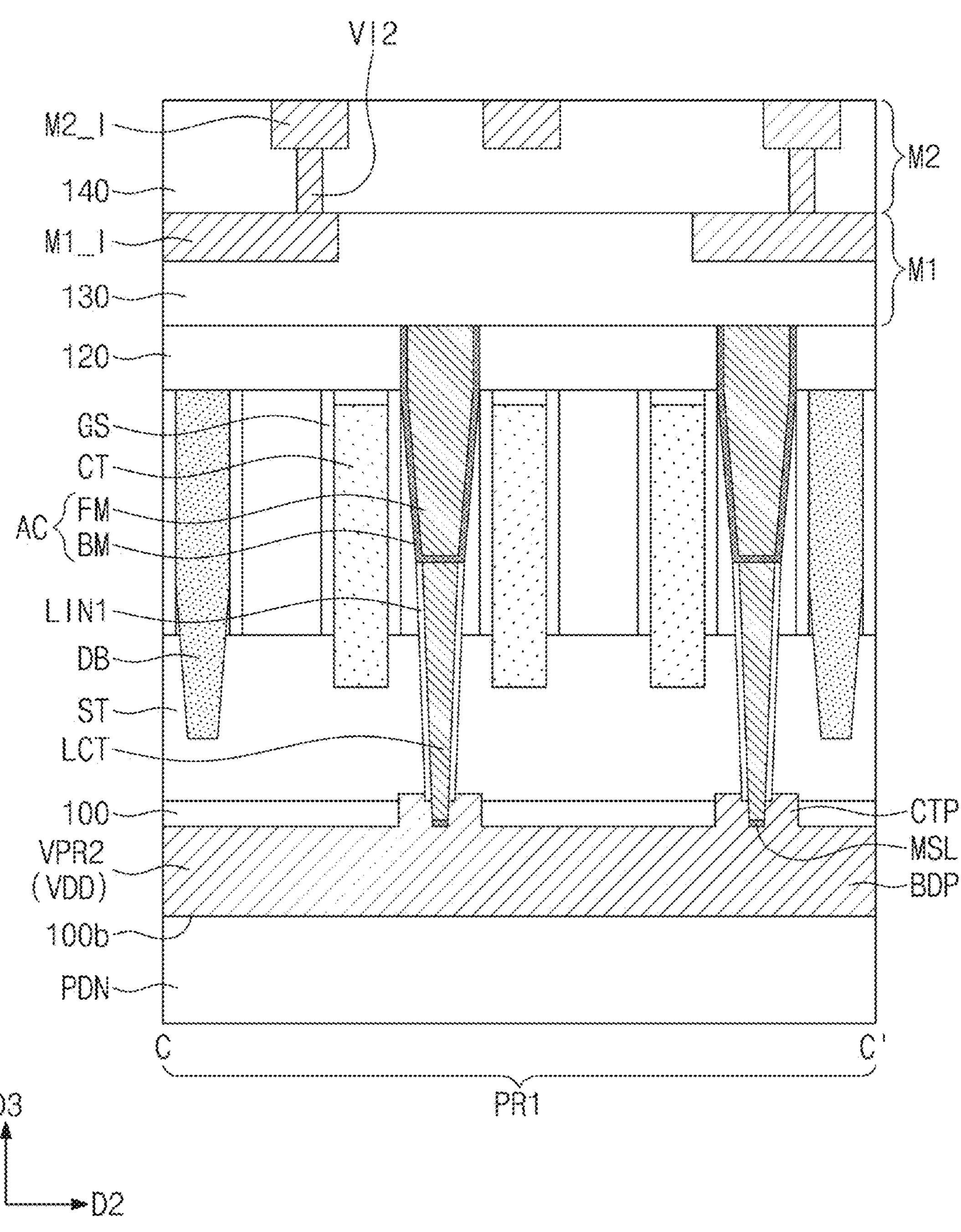
Figure 5D:
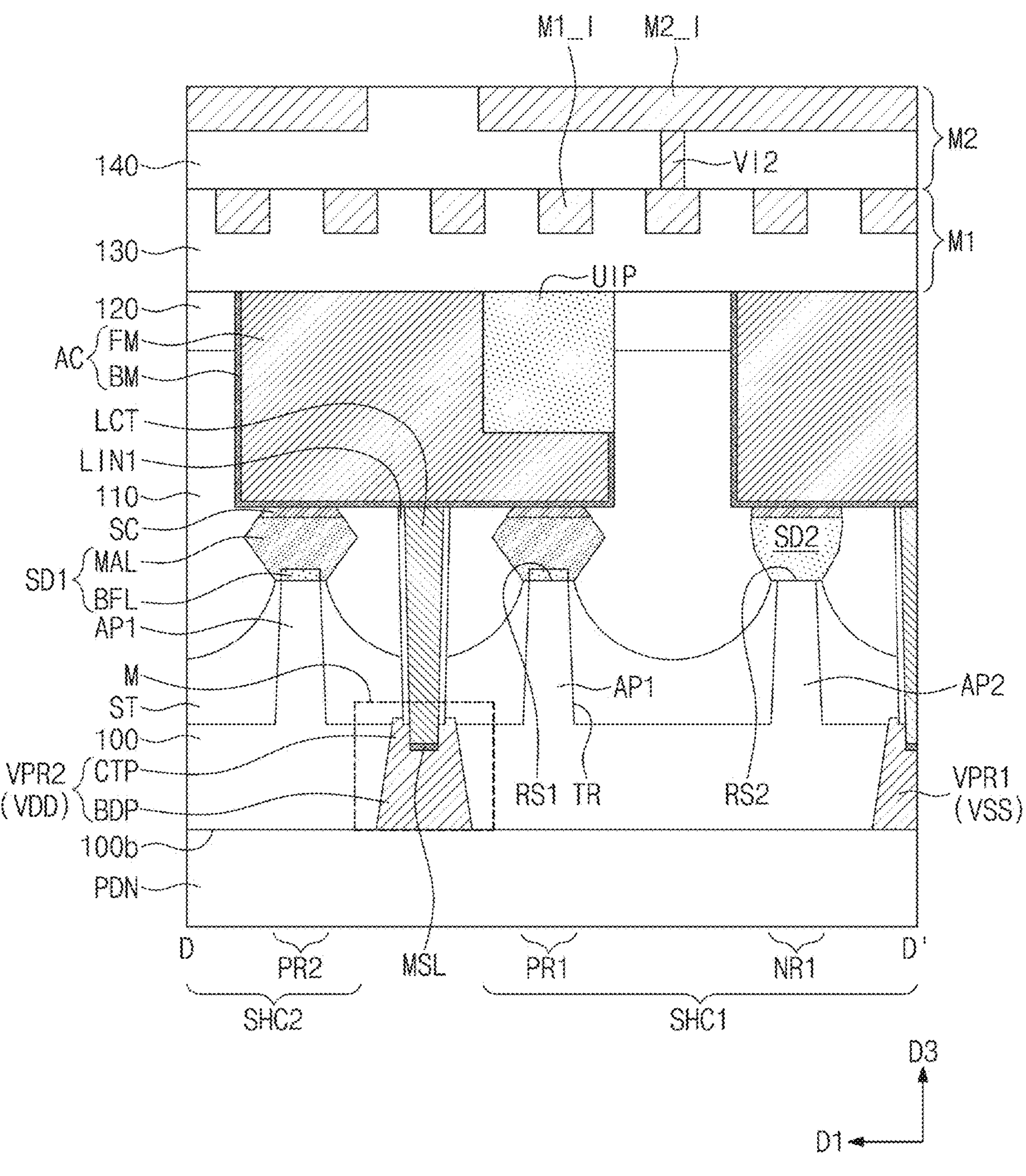
Figure 5E:
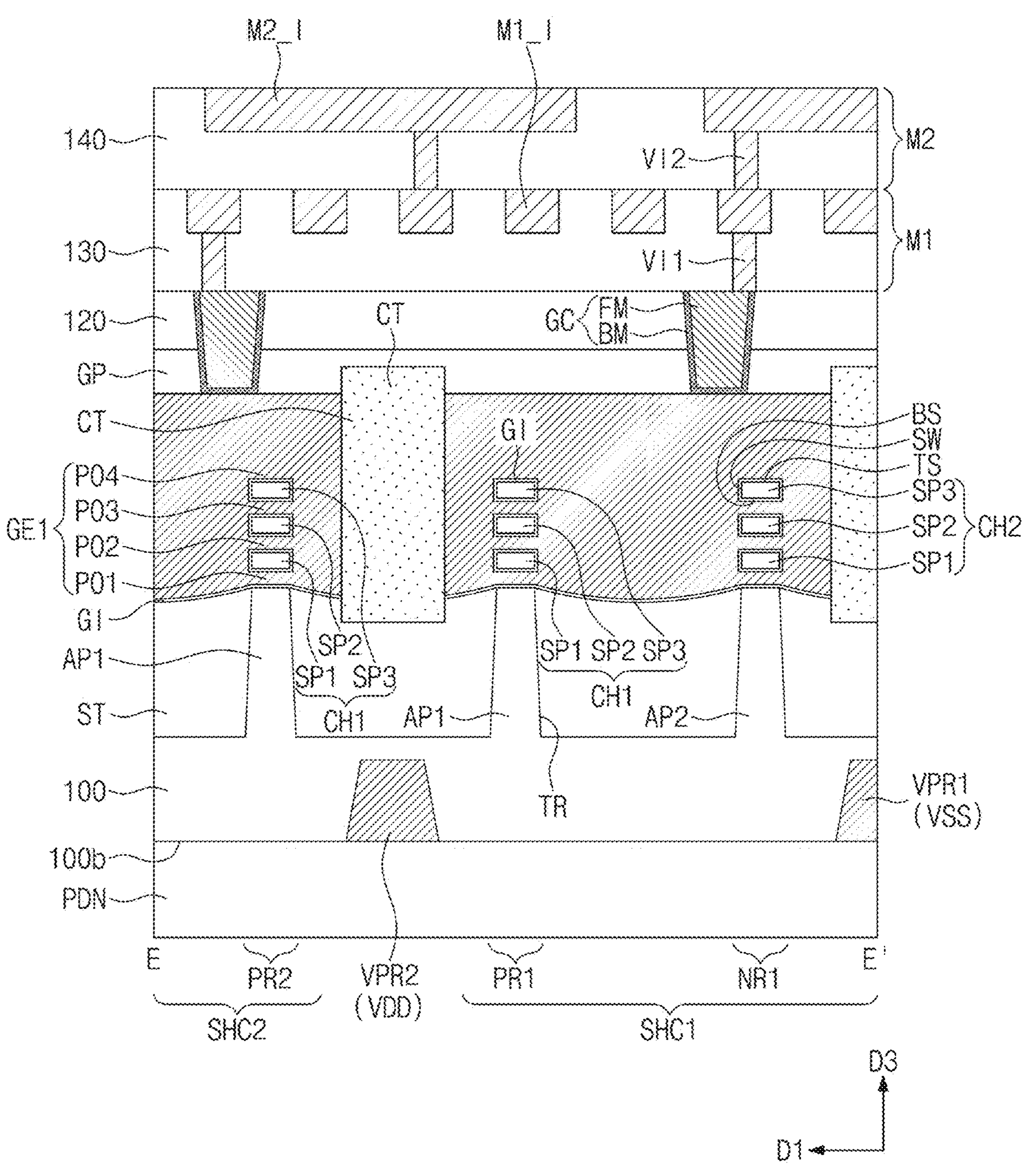
Figure 6:
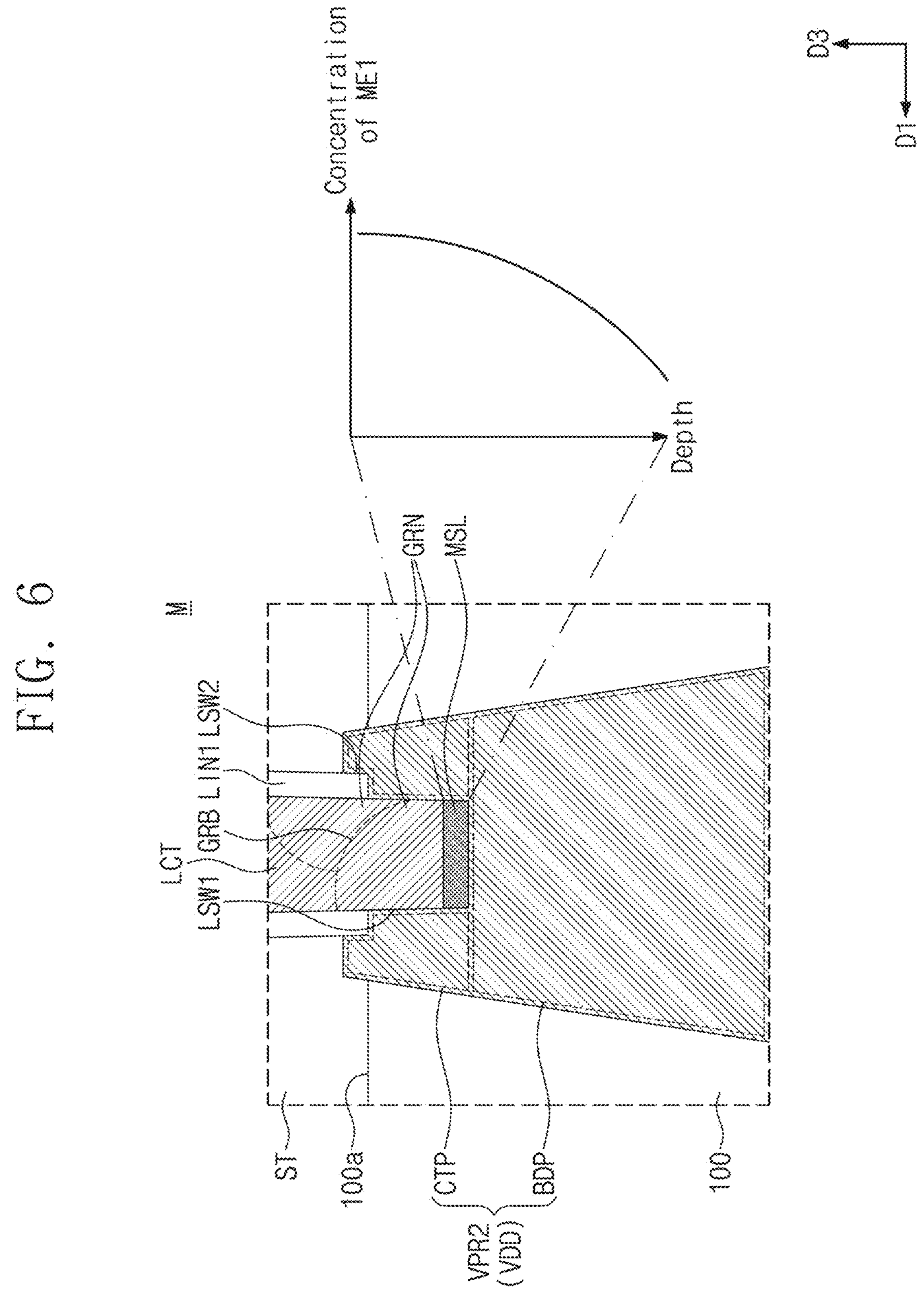
FIG. 6 illustrates an enlarged cross-sectional view showing section M of FIG. 5D.

In an example embodiment of inventive concepts, referring to FIGS. 5A and 5D, an upper dielectric pattern UIP may fill an upper portion of the active contact AC adjacent to the gate contact GC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC.

Therefore, it may be possible to limit and/or prevent a short-circuit resulting from contact between the gate contact GC and its adjacent active contact AC. For example, the upper dielectric pattern UIP may include a silicon-based dielectric material (e.g., a silicon oxide layer, a silicon nitride layer, or a silicon oxynitride layer).

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

Referring back to FIGS. 4 and 5C to 5E, first, second, and third lower power lines VPR1, VPR2, and VPR3 may be provided on a lower portion of the substrate 100. The first, second, and third lower power lines VPR1, VPR2, and VPR3 may extend in parallel to each other in the second direction D2. The first lower power line VPR1 may be disposed on the fourth boundary BD4 of the first single height cell SHC1. The second lower power line VPR2 may be disposed on the third boundary BD3 of the first single height cell SHC1. For example, the first single height cell SHC1 may be defined between the first lower power line VPR1 and the second lower power line VPR2. The second single height cell SHC2 may be defined between the second lower power line VPR2 and the third lower power line VPR3.

Referring back to FIGS. 5C and 5D, representatively, the second lower power line VPR2 may be electrically connected to a lower contact LCT. The lower contact LCT may electrically connect the second lower power line VPR2 to the active contact AC. For example, the lower contact LCT may be directly coupled to the active contact AC. The lower power lines VPR1 to VPR3 may be electrically connected through the lower contact LCT and the active contact AC to the source/drain patterns SD1 and SD2.

The lower contact LCT and the lower power lines VPR1 to VPR3 may include the same or different metals. For example, the lower power lines VPR1 to VPR3 may include at least one selected from copper, molybdenum, tungsten, and ruthenium. The lower contact LCT may include at least one selected from molybdenum, tungsten, and ruthenium. In an embodiment of inventive concepts, the lower contact LCT may have a lower portion surrounded by one or more of the lower power lines VPR1 to VPR3. A detailed description thereof will be further discussed below with reference to FIG. 6.

The lower contact LCT may have a width (or diameter) that increases in the third direction D3. For example, the width of the lower contact LCT may decrease with decreasing distance from a bottom surface 100*b* of the substrate 100. The lower power lines VPR1 to VPR3 may have their line-widths each of which increases with decreasing distance from the bottom surface 100*b* of the substrate 100.

A first liner LIN1 may be provided on a sidewall of the lower contact LCT. The first liner LIN1 may serve as a spacer of the lower contact LCT. The first liner LIN1 may include a silicon-based dielectric material (e.g., SiO, SiN, SiOC, or SiOCN).

The lower power lines VPR1 to VPR3 may have their bottom surfaces that are coplanar with the bottom surface 100*b* of the substrate 100. A power delivery network layer PDN may be provided on the bottom surface 100*b* of the substrate 100. The power delivery network layer PDN may include a plurality of lower lines electrically connected to the first to third lower power lines VPR1, VPR2, and VPR3. For example, the power delivery network layer PDN may include a wiring network for applying a source voltage VSS to the first and third lower power lines VPR1 and VPR3. The power delivery network layer PDN may include a wiring network for applying a drain voltage VDD to the second lower power line VPR2.

A first metal layer M1 may be provided in the third interlayer dielectric layer 130. The first metal layer M1 may include first wiring lines M1_I. The first wiring lines M1_I of the first metal layer M1 may extend in parallel to each other in the second direction D2.

According to some embodiments of inventive concepts, a power line for supplying power to the single height cell SHC1 or SHC2 may be provided as the lower power lines VPR1 to VPR3 buried in the substrate 100. Therefore, a power line may be omitted in the first metal layer M1. The first metal layer M1 may be provided therein with the first wiring lines M1_I for signal transfer.

The first metal layer M1 may further include first vias VI1. The first vias VI1 may be correspondingly provided below the first wiring lines M1_I of the first metal layer M1. The active contact AC may be electrically connected through the first via VI1 to the first wiring line M1_I of the first metal layer M1. The gate contact GC may be electrically connected through the first via VI1 to the first wiring line M1_I of the first metal layer M1.

The first wiring line M1_I and its underlying first via VI1 of the first metal layer M1 may be formed by individual processes. For example, the first wiring line M1_I and the first via VI1 of the first metal layer M1 may each be formed by a single damascene process. A sub-20 nm process may be employed to fabricate a semiconductor device according to some embodiments.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may extend in parallel to each other in the first direction D1.

The second metal layer M2 may further include second vias VI2 that are correspondingly provided below the second wiring lines M2_I. The first wiring line M1_I of the first metal layer M1 may be electrically connected through the second via VI2 to the second wiring line M2_I of the second metal layer M2. For example, a dual damascene process may be employed to simultaneously form the second wiring line M2_I and its underlying second via VI2 of the second metal layer M2.

The first wiring line M1_I of the first metal layer M1 and the second wiring line M2_I of the second metal layer M2 may include the same or different conductive materials. For example, the first wiring line M1_I of the first metal layer M1 and the second wiring line M2_I of the second metal layer M2 may include at least one metallic material selected from aluminum, copper, tungsten, molybdenum, ruthenium, and cobalt. Although not shown, other metal layers (e.g., M3, M4, M5, etc.) may be additionally stacked on the fourth interlayer dielectric layer 140. Each of the stacked metal layers may include wiring lines for routing between cells.

Referring to FIGS. 5C and 6, representatively, the second lower power line VPR2 may include a body part BDP and a connection part CTP on the body part BDP. The body part BDP may have a linear shape that extends in the second direction D2. The connection part CTP may extend in the third direction D3 from the body part BDP. The connection part CTP may be in direct contact with the lower contact LCT.

The connection part CTP may surround the lower contact LCT. The connection part CTP may have a crater or dome shape that surrounds the lower contact LCT. For example, the connection part CTP may be in direct contact with a first lower sidewall LSW1 of the lower contact LCT. In addition, the connection part CTP may be in direct contact with a second lower sidewall LSW2 of the first liner LIN1.

The first lower sidewall LSW1 of the lower contact LCT may be positioned lower than a top surface 100*a* of the substrate 100. For example, a lower portion of the lower contact LCT may protrude downward relative to the top surface 100*a* of the substrate 100. The connection part CTP may surround the lower contact LCT that protrudes downward relative to the top surface 100*a* of the substrate 100. An uppermost surface of the connection part CTP may be positioned higher than the top surface 100*a* of the substrate 100. Therefore, the connection part CTP may completely surround the lower contact LCT.

A conductive layer MSL may be interposed between the body part BDP and the lower contact LCT. The conductive layer MSL may include silicon (Si) and a first element ME1. The first element ME1 may be a transition metal or a metalloid. For example, the first element ME1 may include at least one selected from titanium (Ti), molybdenum (Mo), and germanium (Ge).

In an embodiment of inventive concepts, when the first element ME1 is a transition metal, the conductive layer MSL may include a metal-silicide layer. In another embodiment of inventive concepts, when the first element ME1 is a metalloid, the conductive layer MSL may include a semiconductor epitaxial layer.

As shown in FIG. 6, a concentration of the first element ME1 in the conductive layer MSL may abruptly decrease with decreasing distance from the body part BDP. The concentration of the first element ME1 in the conductive layer MSL may have a maximum value at a bottom surface of the lower contact LCT and a minimum value at an interface between the body part BDP and the conductive layer MSL.

The lower contact LCT may be a metal that is grown in a bottom-up fashion from the conductive layer MSL that serves as a nucleation site. For example, the lower contact LCT may include a metal that is grown in the third direction D3 from the conductive layer MSL. The lower contact LCT may include a second element ME2 that is a transition metal. The second element ME2 may include at least one selected from molybdenum (Mo), tungsten (W), and ruthenium (Ru). The second element ME2 may be the same as or different from the first element ME1.

The lower contact LCT may include grains GRN. Each of the grains GRN may have a body centered cubic (BCC) structure or face centered cubic (FCC) structure. A grain boundary GRB may be defined between the grains GRN. The grains GRN in the lower contact LCT may each have an average grain size ranging from about 100 Å to about 500 Å.

As discussed above, when the lower contact LCT is formed by bottom-up growth from the conductive layer MSL, each of the grains GRN may have a relatively large grain size. When an average grain size of the lower contact LCT is relatively large, the lower contact LCT may have a reduced resistivity. For example, the lower contact LCT of inventive concepts may have a resistivity ranging from about 10 μΩcm to about 18 μΩcm. As a result, the lower contact LCT according to inventive concepts may have an extremely small resistivity, and thus a device may have excessively improved electrical properties.

As discussed above, the connection part CTP may surround a lower portion of the lower contact LCT. Thus, there may be an increased contact area between the second lower power line VPR2 and the lower contact LCT. Accordingly, a contact resistance may be reduced between the second lower power line VPR2 and the lower contact LCT, and a device may increase in electrical properties.

Figure 7A:
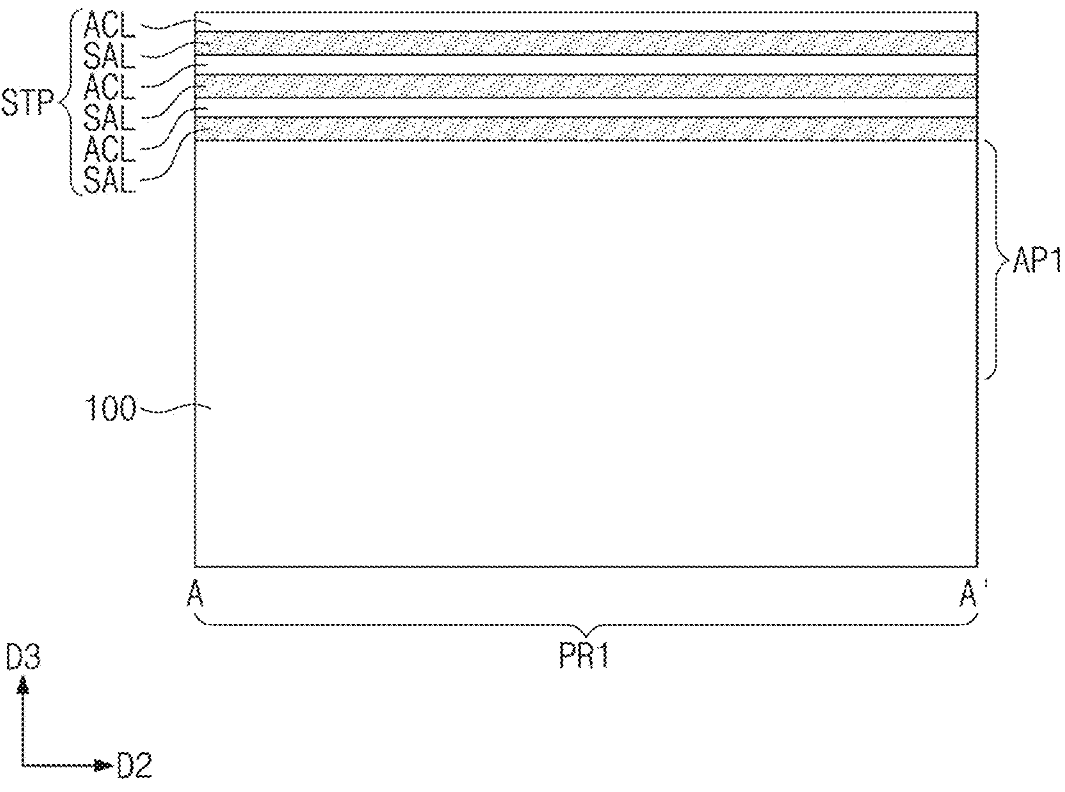
FIGS. 7A and 14 illustrate cross-sectional views showing a method of fabricating a semiconductor device according to some embodiments of inventive concepts.
Figure 13:
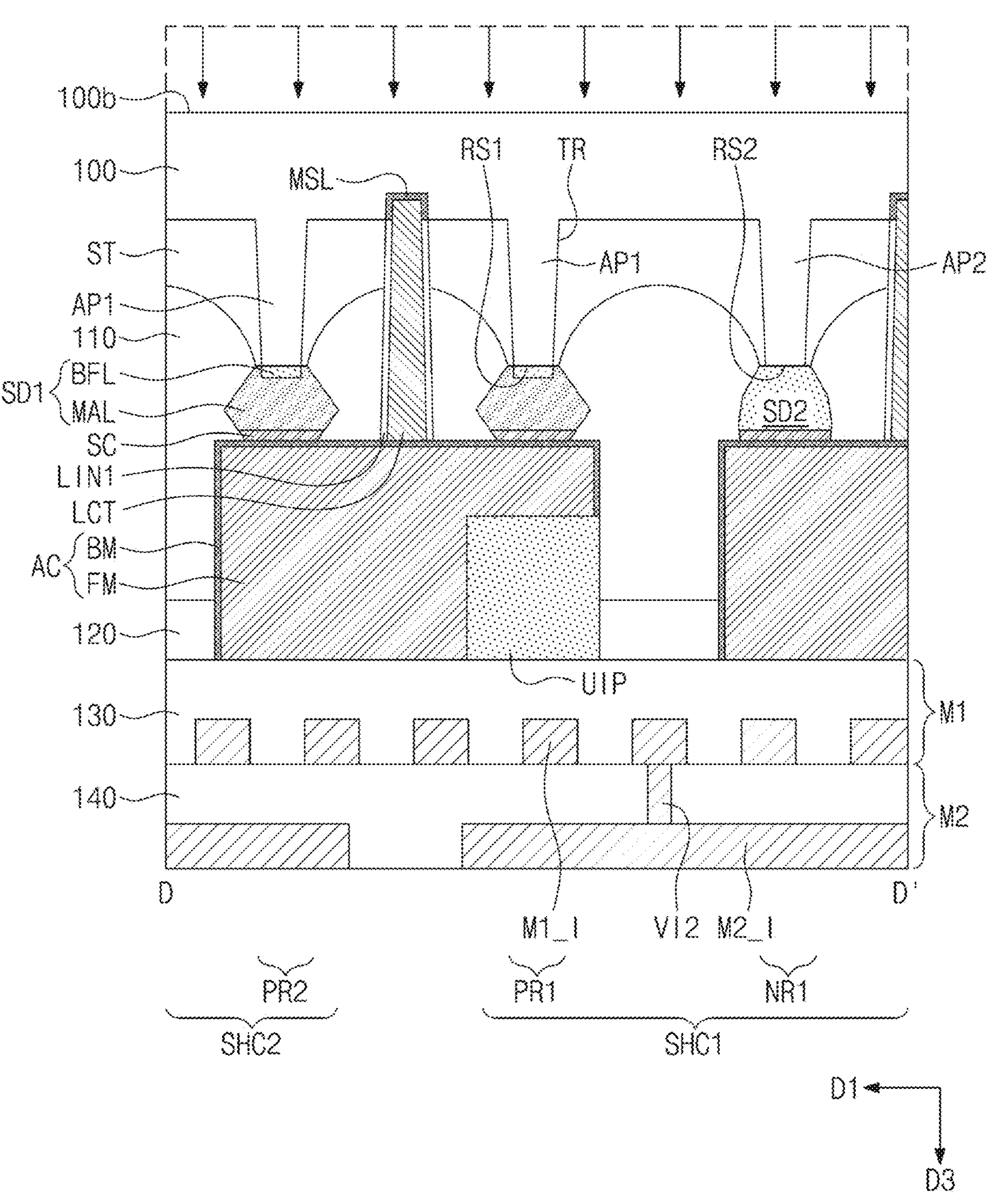
Figure 14:
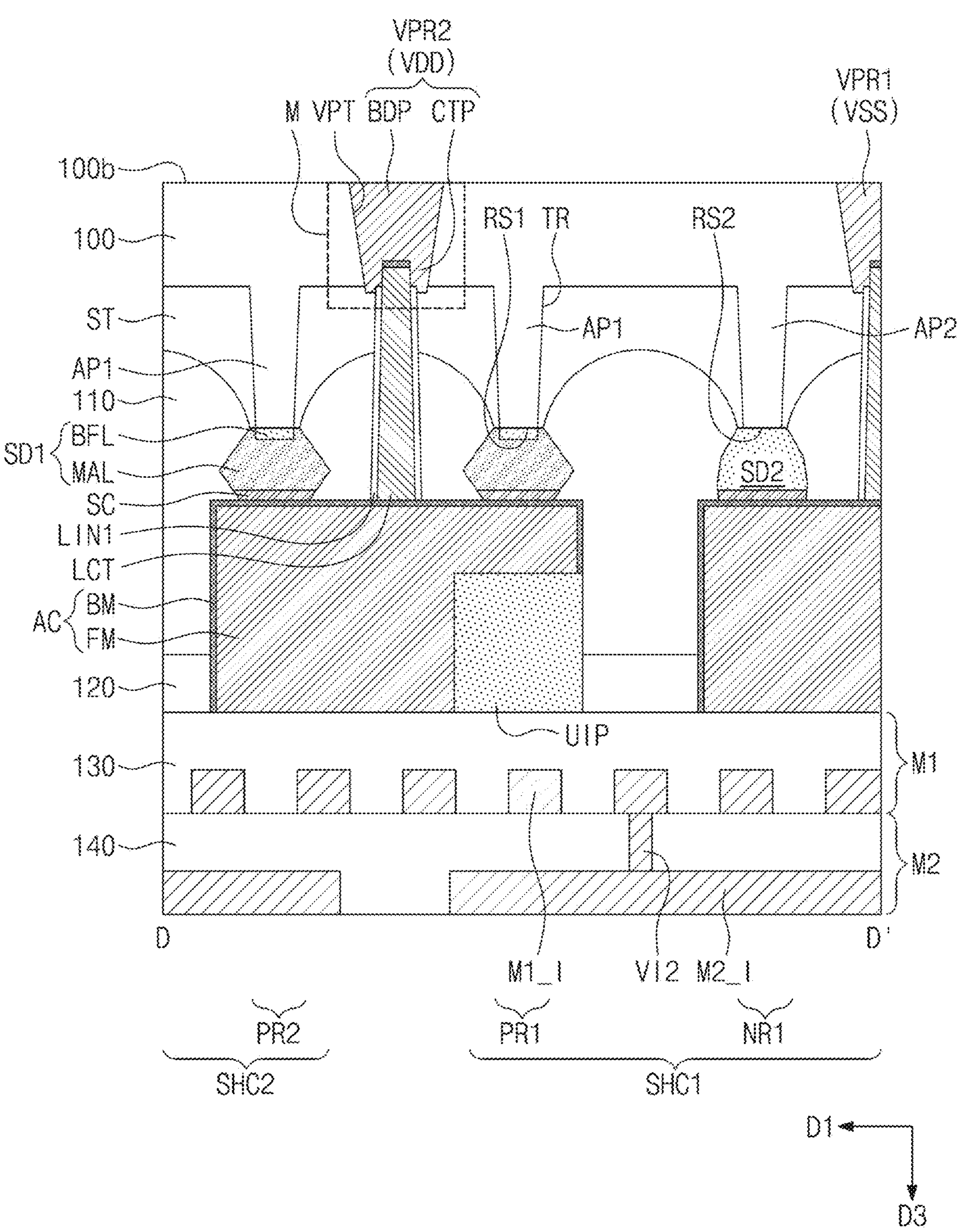

FIGS. 7A and 14 illustrate cross-sectional views showing a method of fabricating a semiconductor device according to some embodiments of inventive concepts. For example, FIGS. 7A, 8A, 9A, 10A, 11A, and 12A illustrate cross-sectional views taken along line A-A' of FIG. 4. FIGS. 9B, 10B, 11B, and 12B illustrate cross-sectional views taken along line B-B' of FIG. 4. FIGS. 9C, 10C, 12C, 13, and 14 illustrate cross-sectional views taken along line D-D' of FIG. 4. FIGS. 7B, 8B, 11C, and 12D illustrate cross-sectional views taken along line E-E' of FIG. 4.

Figure 7B:
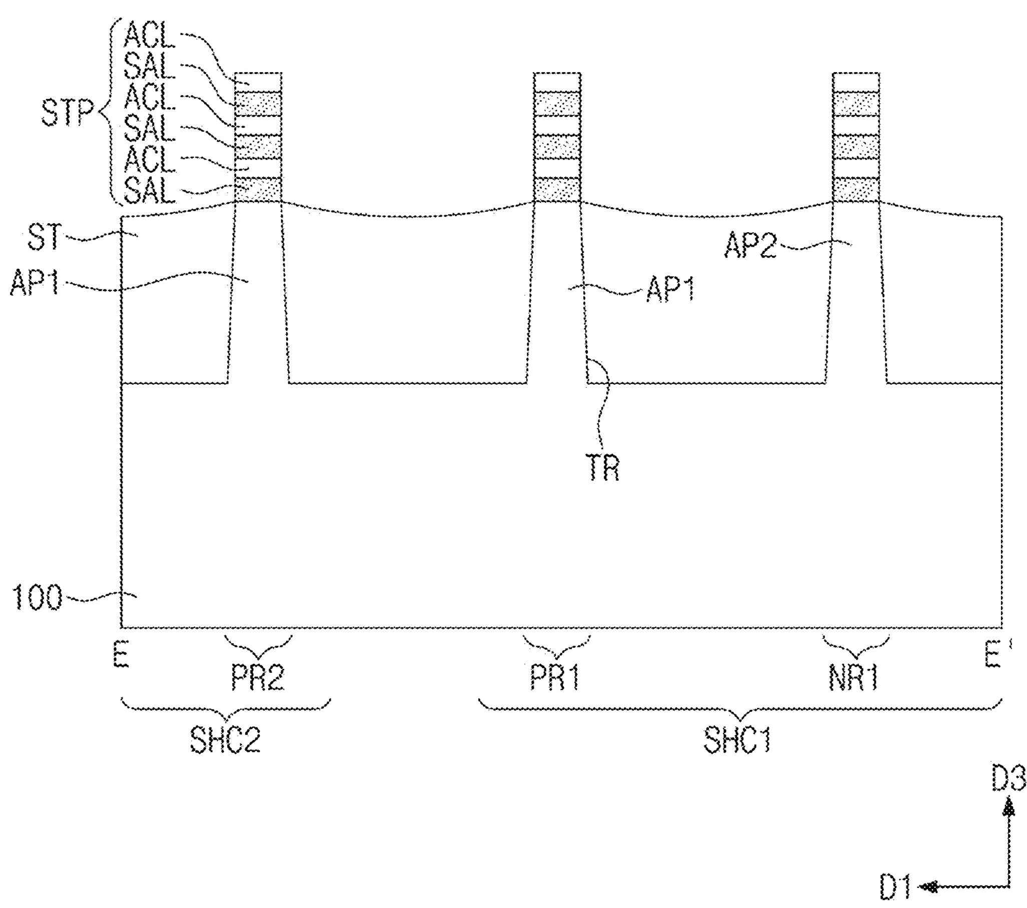

Referring to FIGS. 7A and 7B, a substrate 100 may be provided which includes first and second PMOSFET regions PR1 and PR2 and first and second NMOSFET regions NR1 and NR2. First semiconductor layers ACL and second semiconductor layers SAL may be formed and alternately stacked on the substrate 100. The first semiconductor layers ACL may include one of silicon (Si), germanium (Ge), and silicon-germanium (SiGe), and the second semiconductor layers SAL may include another of silicon (Si), germanium (Ge), and silicon-germanium (SiGe).

The second semiconductor layer SAL may include a material having an etch selectivity with respect to the first semiconductor layer ACL. For example, the first semiconductor layers ACL may include silicon (Si), and the second semiconductor layers SAL may include silicon-germanium (SiGe). A concentration of germanium (Ge) in each of the second semiconductor layers SAL may range from about 10 at % to about 30 at %.

Mask patterns may be correspondingly formed on the first and second PMOSFET regions PR1 and PR2 and the first and second NMOSFET regions NR1 and NR2 of the substrate 100. The mask pattern may have a linear or bar shape that extends in a second direction D2.

A patterning process may be performed in which the mask patterns are used as an etching mask to form a trench TR that defines a first active pattern AP1 and a second active pattern AP2. The first active pattern AP1 may be formed on each of the first and second PMOSFET regions PR1 and PR2. The second active pattern AP2 may be formed on each of the first and second NMOSFET regions NR1 and NR2. When viewed in plan, the first and second active patterns AP1 and AP2 may each have a linear shape that extends in the second direction D2.

A stack pattern STP may be formed on each of the first and second active patterns AP1 and AP2. The stack pattern STP may include the first semiconductor layers ACL and the second semiconductor layers SAL that are alternately stacked on each other. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwardly from the device isolation layer ST. For example, the stack patterns STP may vertically protrude upwardly from the device isolation layer ST.

Figure 8A:
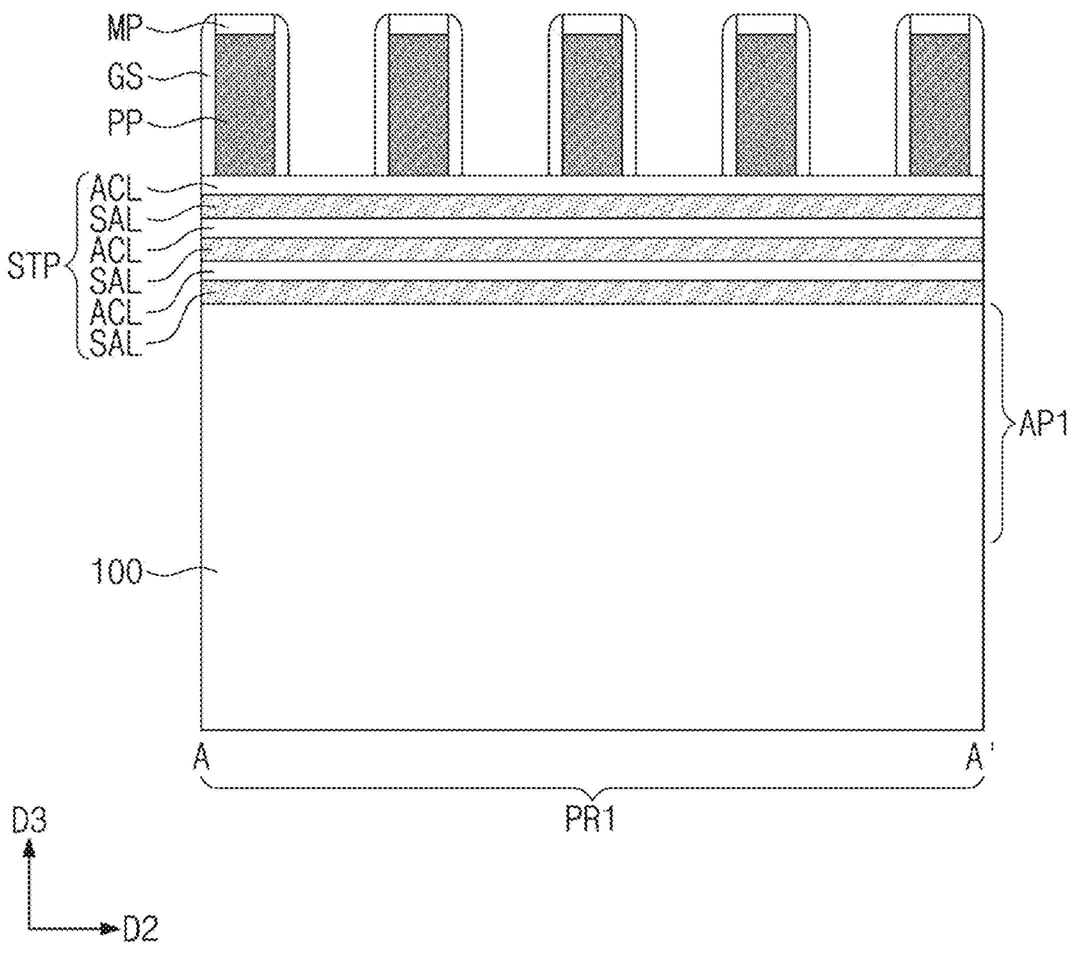
Figure 8B:
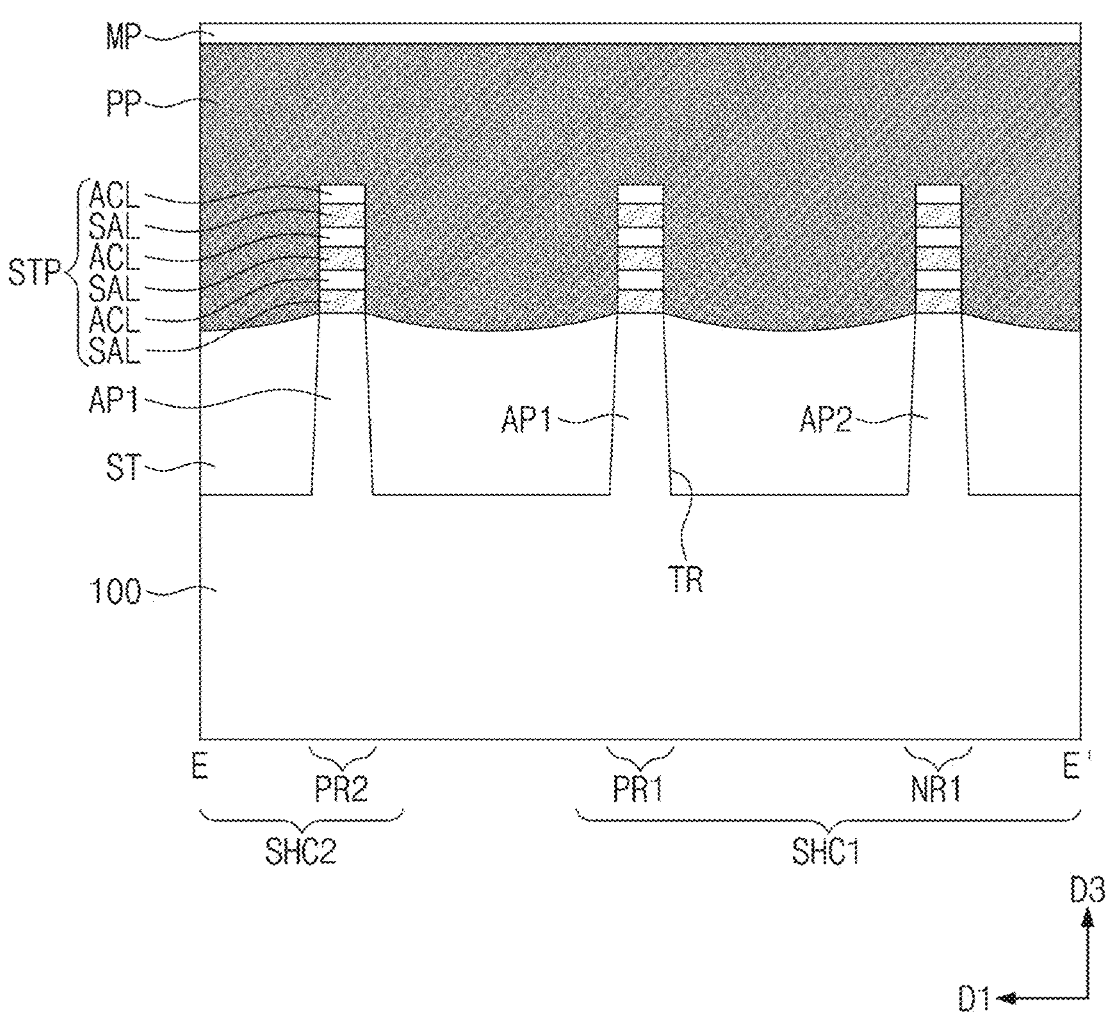

Referring to FIGS. 8A and 8B, sacrificial patterns PP may be formed on the substrate 100, running across the stack patterns STP. Each of the sacrificial patterns PP may be formed to have a linear or bar shape that extends in a first direction D1. The sacrificial patterns PP may be arranged at a first pitch along the second direction D2.

For example, the formation of the sacrificial patterns PP may include forming a sacrificial layer on an entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multiple layer including at least two selected from SiCN, SiCON, and SiN.

Figure 9A:
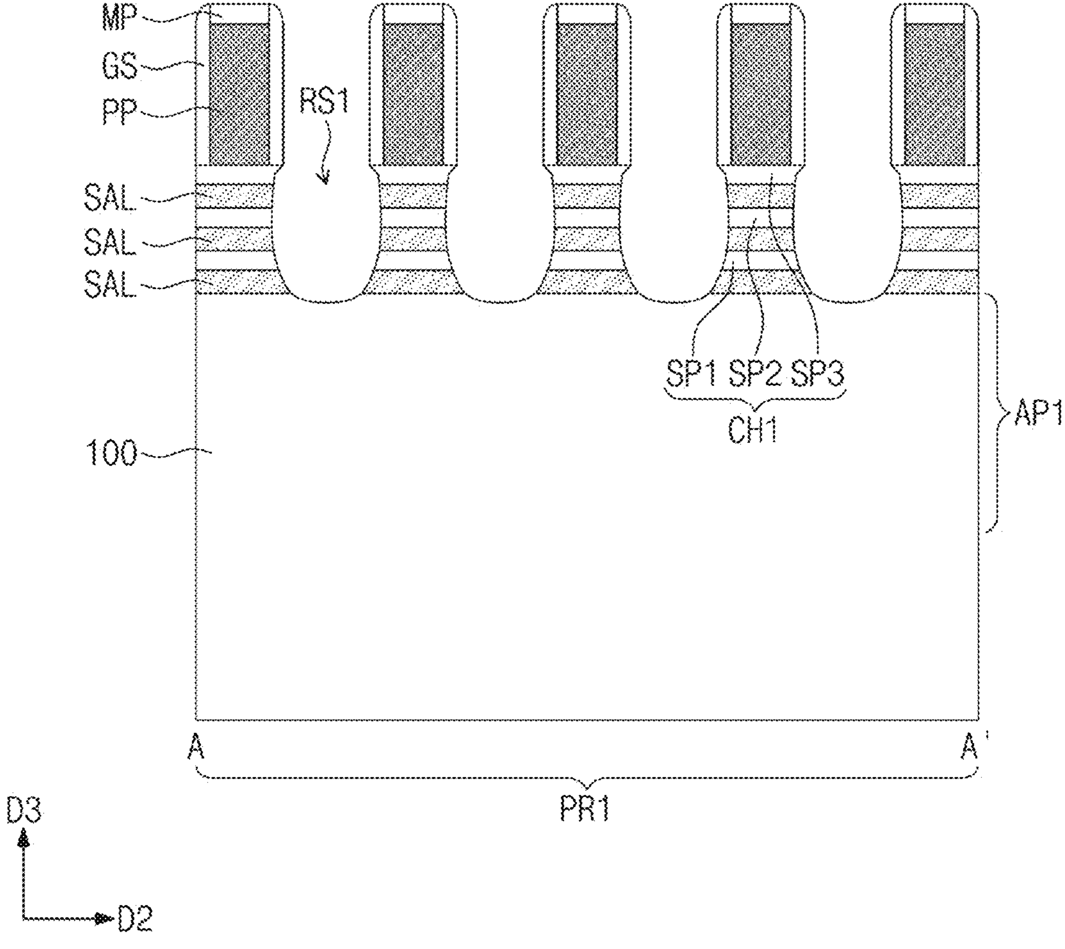
Figure 9B:
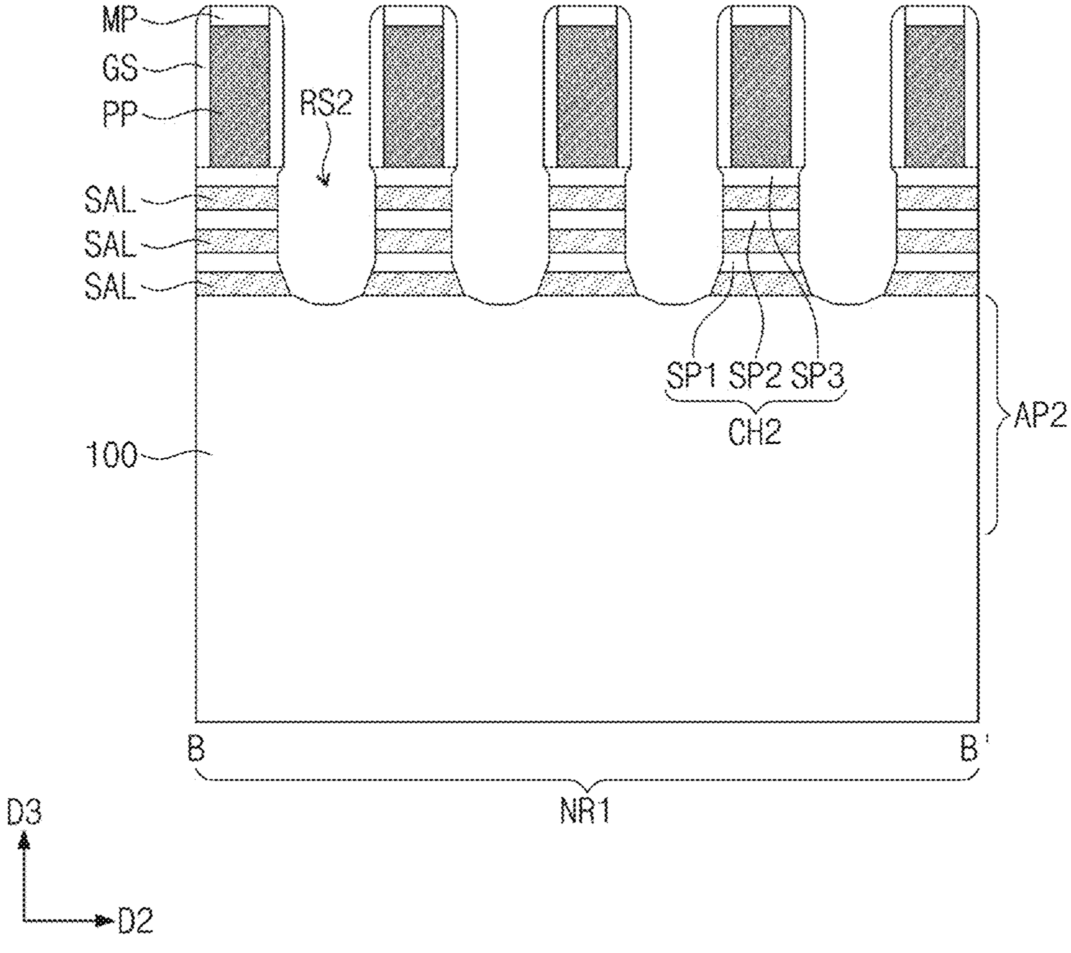
Figure 9C:
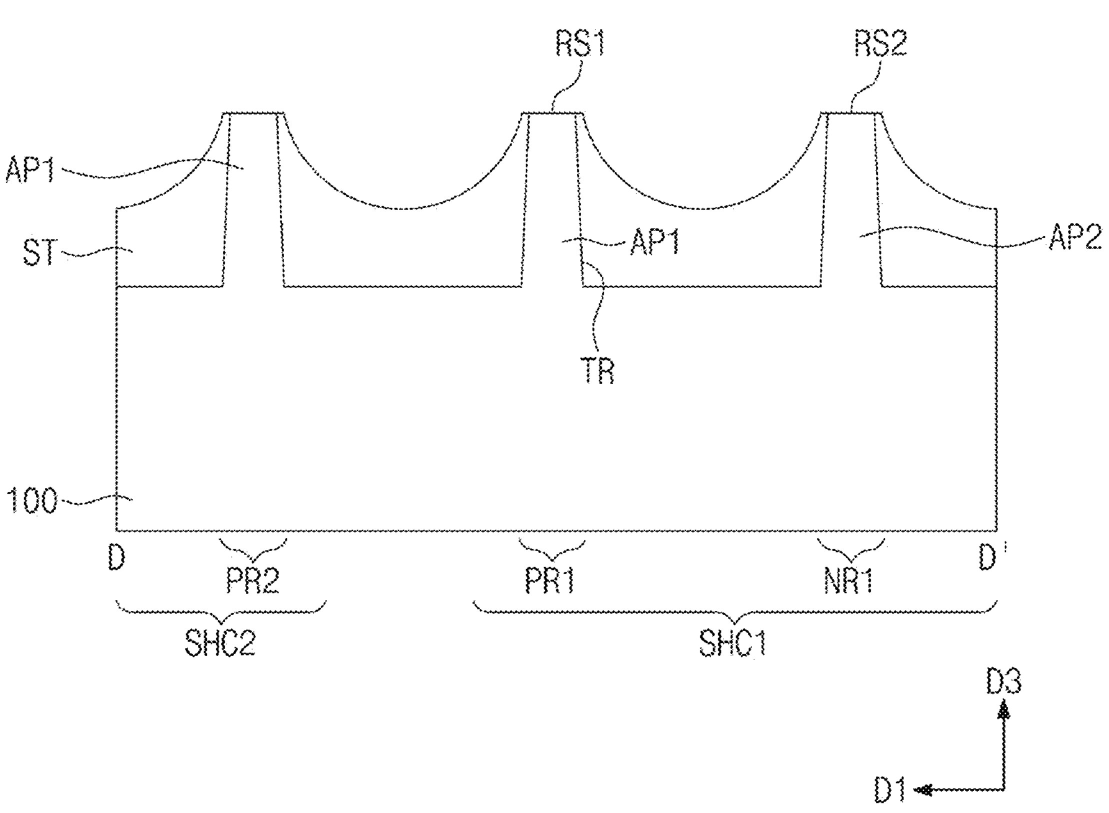

Referring to FIGS. 9A to 9C, first recesses RS1 may be formed in the stack pattern STP on the first active pattern AP1. A plurality of second recesses RS2 may be formed in the stack pattern STP on the second active pattern AP2. During the formation of the first and second recesses RS1 and RS2, the device isolation layer ST may further be recessed on opposite sides of each of the first and second active patterns AP1 and AP2 (see FIG. 9C).

For example, the hardmask patterns MP and the gate spacers GS may be used as an etching mask to etch the stack pattern STP on the first active pattern AP1 to form the first recesses RS1. The first recess RS1 may be formed between a pair of sacrificial patterns PP. The second recesses RS2 in the stack pattern STP on the second active pattern AP2 may be formed by the same method used for the formation of the first recesses RS1.

The first semiconductor layers ACL may be formed into first, second, and third semiconductor patterns SP1, SP2, and SP3 that are sequentially stacked between neighboring first recesses RS1. The first semiconductor layers ACL may be formed into first, second, and third semiconductor patterns SP1, SP2, and SP3 that are sequentially stacked between neighboring second recesses RS2. A first channel pattern CH1 may be constituted by the first, second, and third semiconductor patterns SP1, SP2, and SP3 between neighboring first recesses RS1. A second channel pattern CH2 may be constituted by the first, second, and third semiconductor patterns SP1, SP2, and SP3 between neighboring second recesses RS2.

Figure 10A:
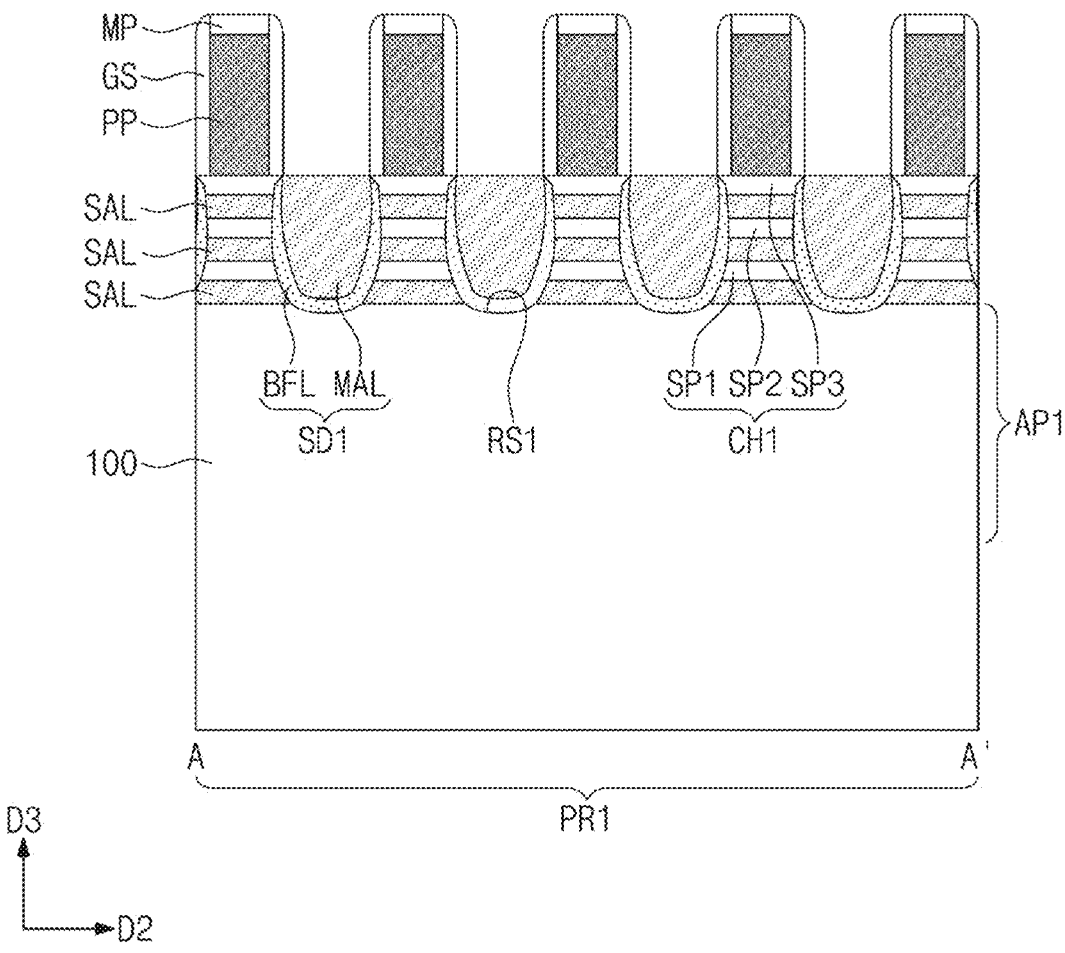
Figure 10B:
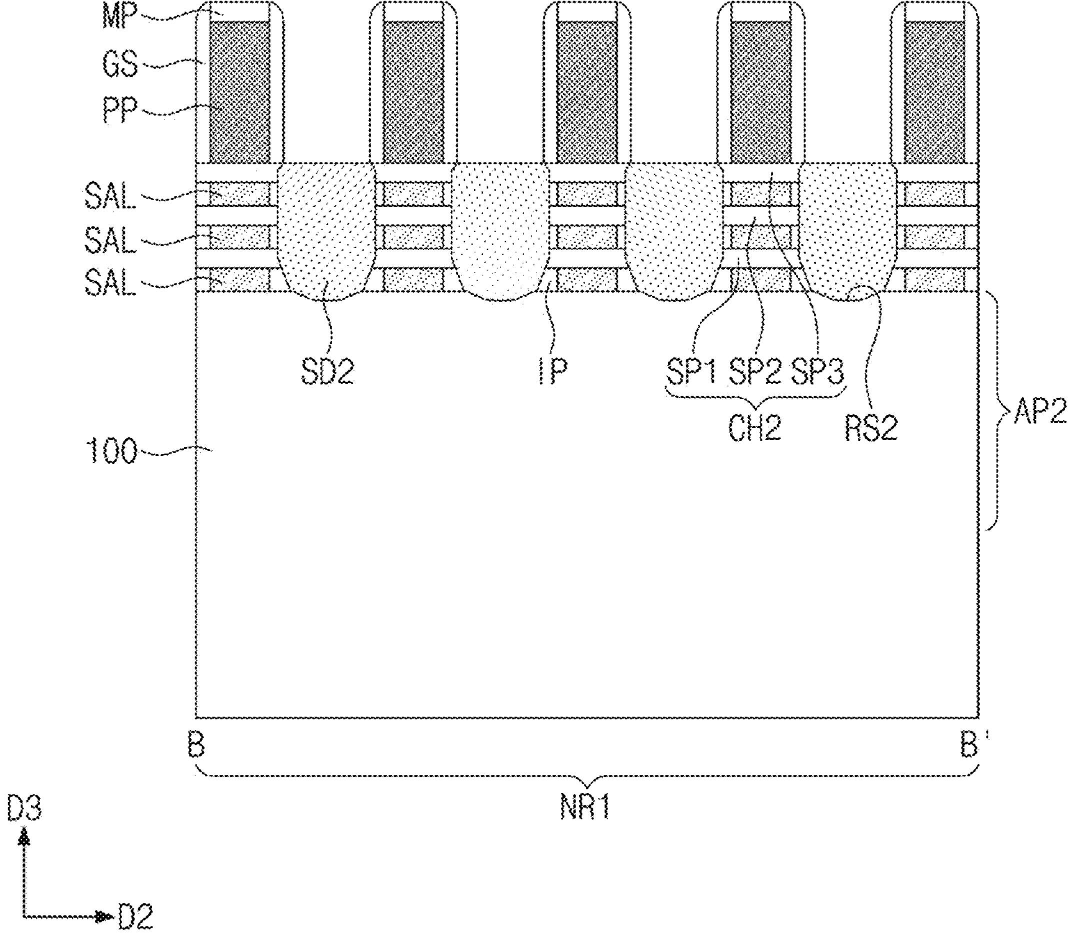
Figure 10C:
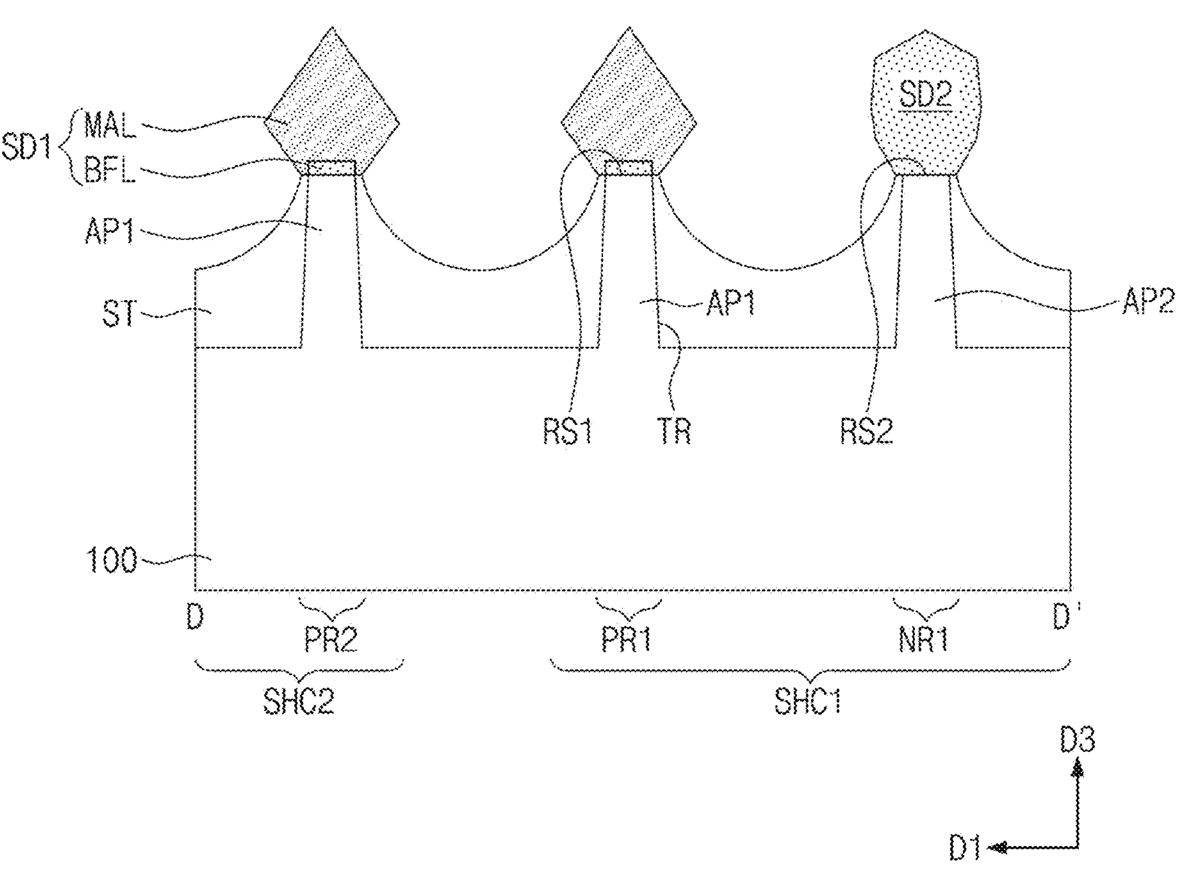

Referring to FIGS. 10A to 10C, first source/drain patterns SD1 may be correspondingly formed in the first recesses RS1. For example, a first selective epitaxial growth (SEG) process may be performed in which an inner wall of the first recess RS1 is used as a seed layer to form a buffer layer BFL. The buffer layer BFL may be grown from a seed, or the substrate 100 and the first, second, and third semiconductor patterns SP1, SP2, and SP3 exposed by the first recess RS1. For example, the first SEG process may include chemical vapor deposition (CVD) or molecular beam epitaxy (MBE).

The buffer layer BFL may include a semiconductor element (e.g., SiGe) whose lattice constant is greater than that of a semiconductor element of the substrate 100. The buffer layer BFL may contain germanium (Ge) whose concentration is relatively low. In another example of inventive concepts, the buffer layer BFL may not include germanium (Ge), but include only silicon (Si). The germanium concentration of the buffer layer BFL may range from about 0 at % to about 30 at %.

The buffer layer BFL may undergo a second SEG process to form a main layer MAL. The main layer MAL may be formed to completely or almost completely fill the first recess RS1. The main layer MAL may contain germanium (Ge) whose concentration is relatively high. For example, the germanium concentration of the main layer MAL may range from about 30 at % to about 70 at %.

In an embodiment of inventive concepts, the main layer MAL may undergo a third SEG process to form a capping layer. The capping layer may include silicon (Si). The capping layer may have a silicon concentration of about 98 at % to about 100 at %.

During the formation of the buffer layer BFL and the main layer MAL, impurities (e.g., boron, gallium, or indium) may be in-situ implanted to allow the first source/drain pattern SD1 to have a p-type conductivity. Alternatively, after the formation of the first source/drain pattern SD1, impurities may be implanted into the first source/drain pattern SD1.

Second source/drain patterns SD2 may be correspondingly formed in the second recesses RS2. For example, the formation of the second source/drain patterns SD2 may include performing a selective epitaxial growth process in which inner sidewalls of the second recesses RS2 are used as seed layers. For example, the second source/drain pattern SD2 may include the same semiconductor element (e.g., Si) as that of the substrate 100.

During the formation of the second source/drain pattern SD2, impurities (e.g., phosphorus, arsenic, or antimony) may be in-situ implanted to allow the second source/drain pattern SD2 to have an n-type conductivity. Alternatively, after the formation of the second source/drain pattern SD2, impurities may be implanted into the second source/drain pattern SD2.

In an embodiment of inventive concepts, before the formation of the second source/drain pattern SD2, the second semiconductor layer SAL exposed through the second recess RS2 may be partially replaced with a dielectric material to form an inner spacer IP. Thus, the inner spacers IP may be formed between the second source/drain pattern SD2 and the second semiconductor layers SAL.

Figure 11A:
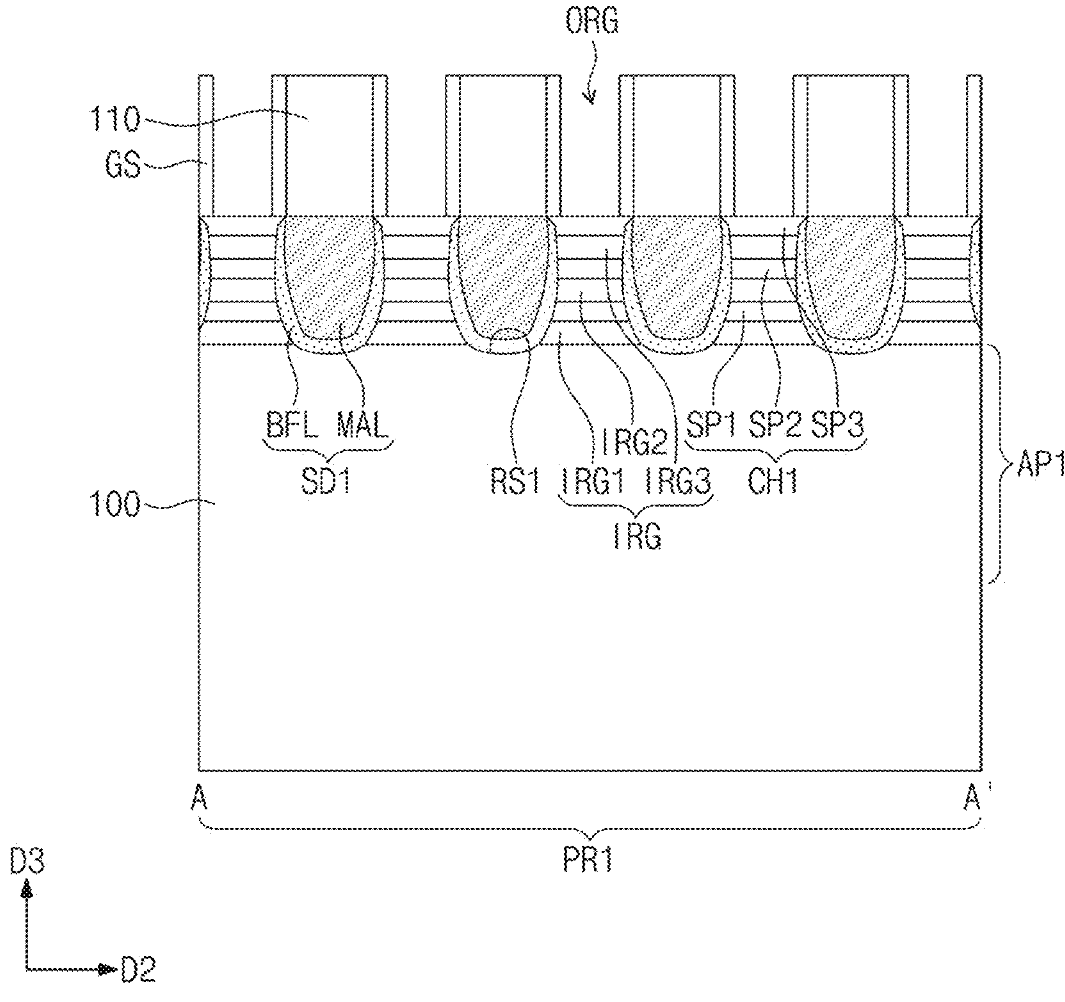
Figure 11B:
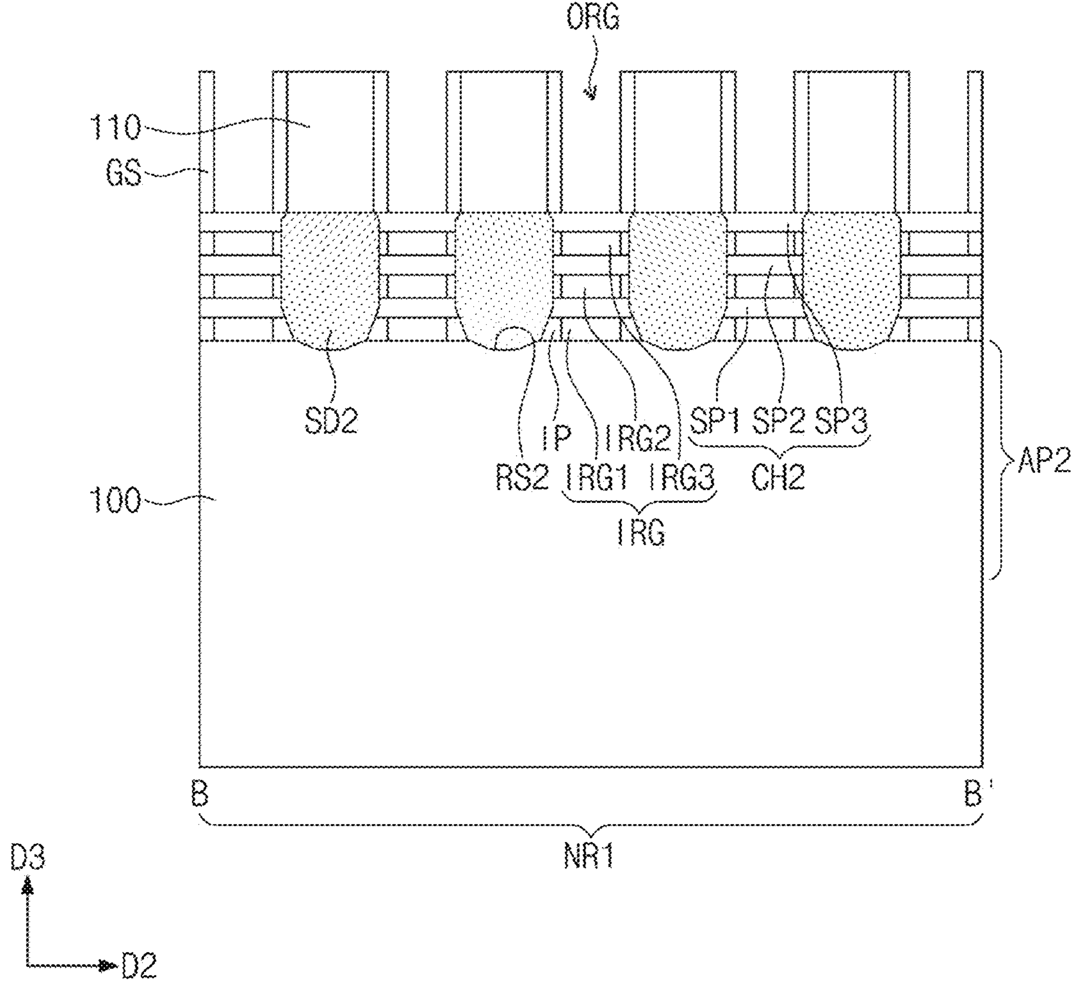
Figure 11C:
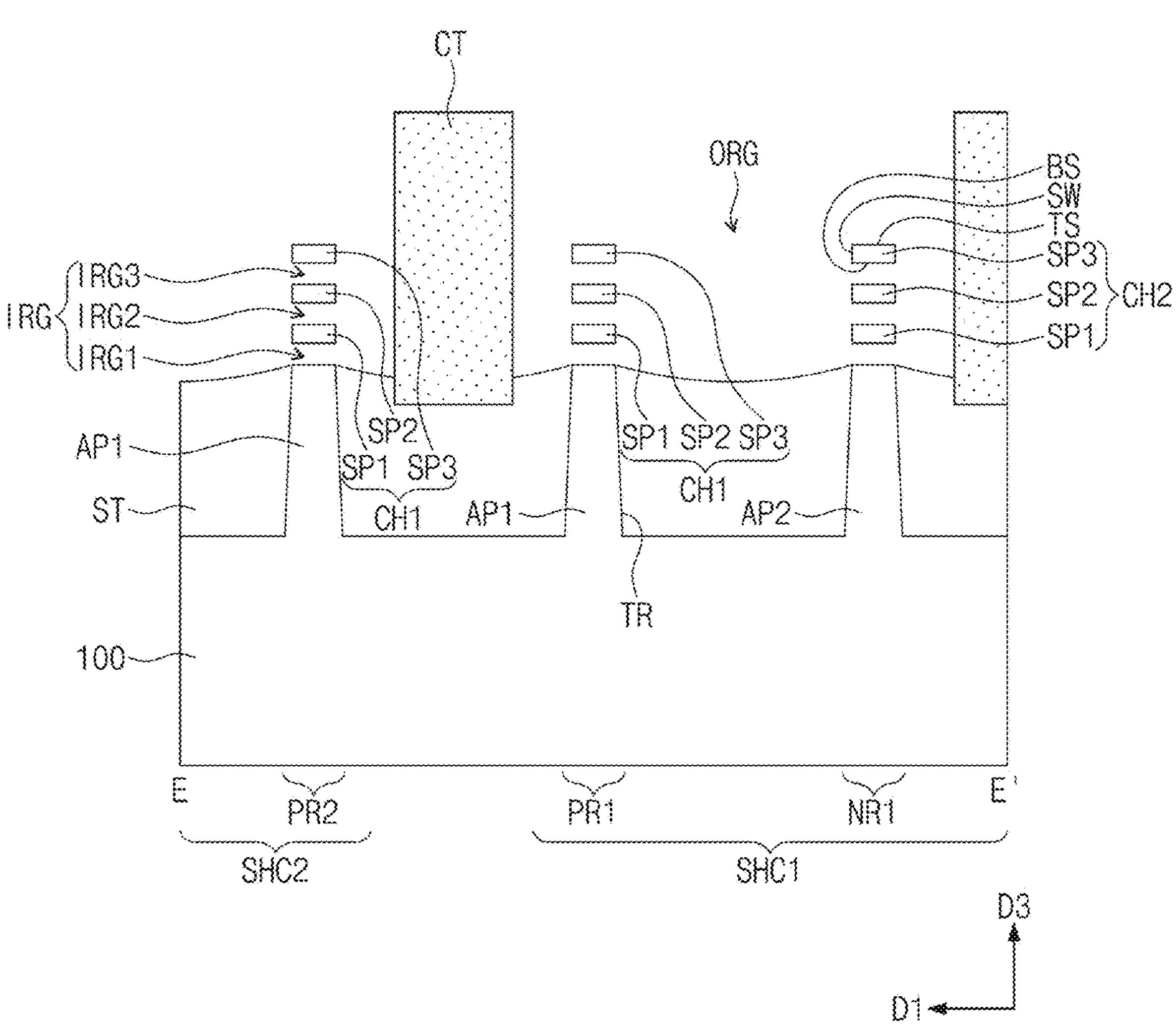

Referring to FIGS. 11A to 11C, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

A photolithography process may be used to selectively open one region of the sacrificial pattern PP. For example, it may be possible to selectively open a region of the sacrificial pattern PP on the third and fourth boundaries BD3 and BD4 of the first single height cell SHC1. The opened portion of the sacrificial pattern PP may be selectively etched and removed. A space where the sacrificial pattern PP is removed may be filled with a dielectric material to form a gate cutting pattern CT (see FIG. 11C).

The exposed sacrificial patterns PP may be selectively removed. The removal of the sacrificial patterns PP may form an outer region ORG that exposes the first and second channel patterns CH1 and CH2 (see FIG. 11C). The removal of the sacrificial patterns PP may include performing a wet etching process using an etchant that selectively etches polysilicon.

The second semiconductor layers SAL exposed through the outer region ORG may be selectively removed to form inner regions IRG (see FIG. 11C). For example, an etching process that selectively etches the second semiconductor layers SAL may be performed such that only the second semiconductor layers SAL may be removed while leaving the first, second, and third semiconductor patterns SP1, SP2, and SP3. The etching process may have a high etch rate with respect to silicon-germanium having a relatively high germanium concentration. For example, the etching process may have a high etch rate with respect to silicon-germanium whose germanium concentration is greater than about 10 at %.

During the etching process, the second semiconductor layers SAL may be completely removed from the first and second PMOSFET regions PR1 and PR2 and from the first and second NMOSFET regions NR1 and NR2. The etching process may be a wet etching process. An etching material used for the etching process may promptly etch the second semiconductor layer SAL whose germanium concentrate is relatively high. During the etching process, the first source/drain pattern SD1 on the first and second PMOSFET regions PR1 and PR2 may be protected by the buffer layer BFL whose germanium concentration is relatively low.

Referring back to FIG. 11C, as the second semiconductor layers SAL are selectively removed, only the stacked first, second, and third semiconductor patterns SP1, SP2, and SP3 may remain on each of the first and second active patterns AP1 and AP2. The removal of the second semiconductor layers SAL may form first, second, and third inner regions IRG1, IRG3, and IRG3. For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 12A to 12D, a gate dielectric layer GI may be conformally formed on the first, second, and third semiconductor patterns SP1, SP2, and SP3 that are exposed. A gate electrode GE may be formed on the gate dielectric layer GI. The gate electrode GE may include first, second, and third inner electrodes PO1, PO2, and PO3 that are respectively formed in the first, second, and third inner regions IRG1, IRG2, and IRG3, and may also include an outer electrode PO4 formed in the outer region ORG.

The gate electrode GE may be recessed to have a reduced height. While the gate electrode GE is recessed, an upper portion of the gate cutting pattern CT may also be slightly recessed. A gate capping pattern GP may be formed on the recessed gate electrode GE.

A second interlayer dielectric layer 120 may be formed on the first interlayer dielectric layer 110. The second interlayer dielectric layer 120 may include a silicon oxide layer. An active contact AC may be formed to penetrate the second and first interlayer dielectric layers 120 and 110 to come into electrical connection with at least one of the first and second source/drain patterns SD1 and SD2. A gate contact GC may be formed to penetrate the second interlayer dielectric layer 120 and the gate capping pattern GP to come into electrical connection with the gate electrode GE.

The formation of each of the active contact AC and the gate contact GC may include forming a barrier pattern BM and forming a conductive pattern FM on the barrier pattern BM. The barrier pattern BM may be conformally formed and may include a metal layer and a metal nitride layer. The conductive patterns FM may include a metal whose resistance is low.

A lower contact LCT may be formed to vertically extend from the active contact AC to the substrate 100.

For example, the lower contact LCT may be formed between a first single height cell SHC1 and a second single height cell SHC2. The lower contact LCT may be formed between a pair of neighboring first source/drain patterns SD1. The lower contact LCT may have a bottom surface lower than that of the device isolation layer ST. A conductive layer MSL may be formed between the lower contact LCT and the substrate 100. A first liner LIN1 may be formed on a sidewall of the lower contact LCT.

The first liner LIN1 may be formed of a silicon-based dielectric material (e.g., a silicon oxide layer, a silicon nitride layer, or a silicon oxynitride layer). The lower contact LCT may be formed of at least one metal selected from molybdenum, tungsten, and ruthenium.

A pair of separation structures DB may be formed on opposite sides of each of the first and second single height cells SHC1 and SHC2. The separation structure DB may penetrate the gate capping pattern GP and the gate electrode GE to extend into the active pattern AP1 or AP2. The separation structure DB may include a dielectric material, such as a silicon oxide layer or a silicon nitride layer.

Referring back to FIGS. 4 and 5A to 5E, a third interlayer dielectric layer 130 may be formed on the active contacts AC and the gate contacts GC. A first metal layer M1 may be formed in the third interlayer dielectric layer 130. The first metal layer M1 may include a first wiring line M1_I electrically connected to at least one of the active contacts AC and the gate contacts GC. A fourth interlayer dielectric layer 140 may be formed on the third interlayer dielectric layer 130. A second metal layer M2 may be formed in the fourth interlayer dielectric layer 140.

Referring to FIG. 13, after a back-end-of-line (BEOL) process is completed, the substrate 100 may be overturned to expose a bottom surface 100*b*. The bottom surface 100*b* of the substrate 100 may undergo a planarization process to reduce a thickness of the substrate 100.

Referring to FIG. 14, the bottom surface 100*b* of the substrate 100 may undergo a patterning process to form a plurality of lower line trenches VPT. Each of the lower line trenches VPT may be formed to expose the lower contact LCT. The lower line trench VPT may be formed aligned with the lower contact LCT. The lower line trench VPT may have a linear shape that extends in the second direction D2.

The lower line trench VPT may be filled with a conductive material to form lower power lines VPR1 to VPR3 each of which is electrically connected to the lower contact LCT. Afterwards, a power delivery network layer PDN may be formed on the bottom surface 100*b* of the substrate 100. The power delivery network layer PDN may be formed to apply a source voltage or a drain voltage to the lower power lines VPR1 to VPR3.

Figure 12A:
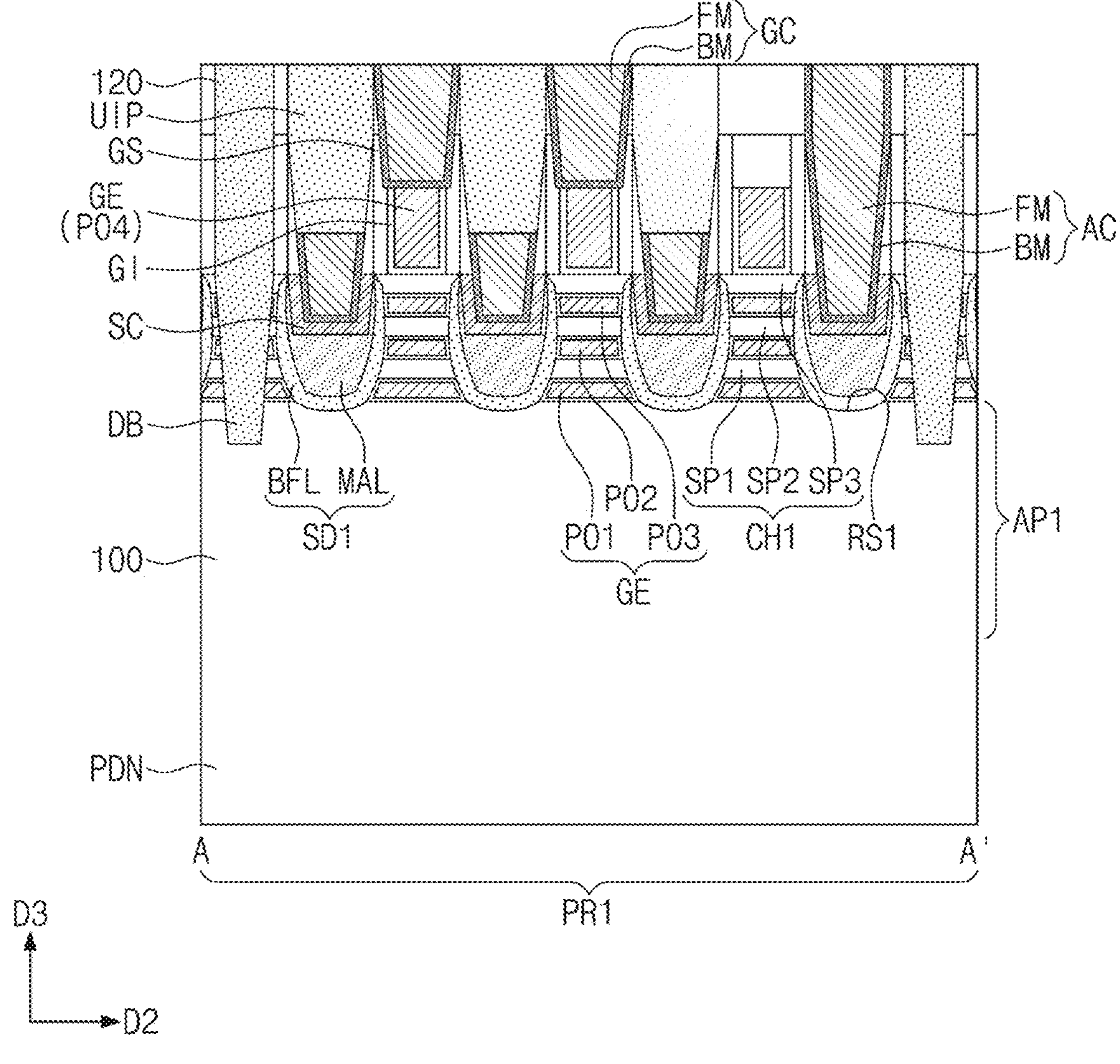
Figure 12B:
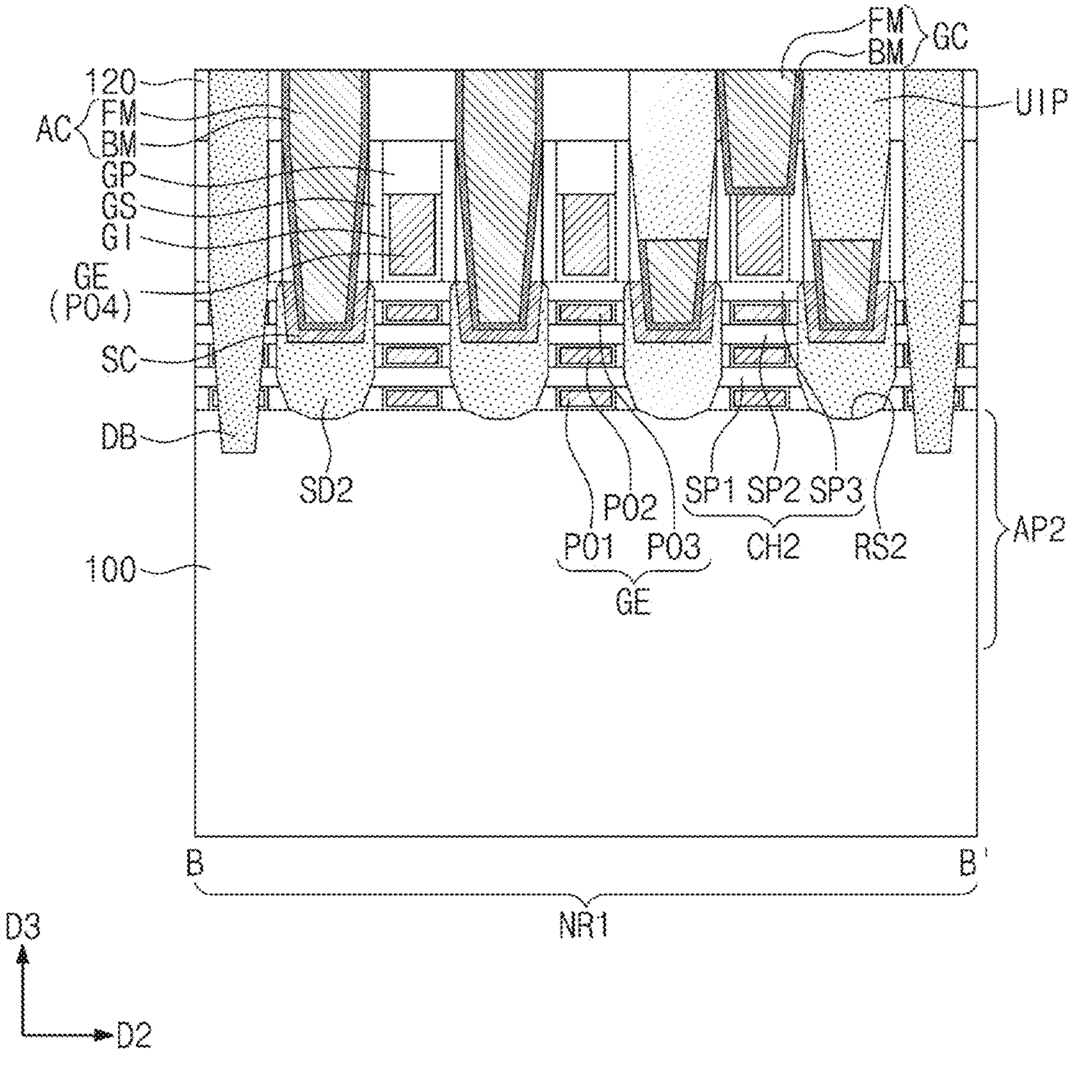
Figure 12C:
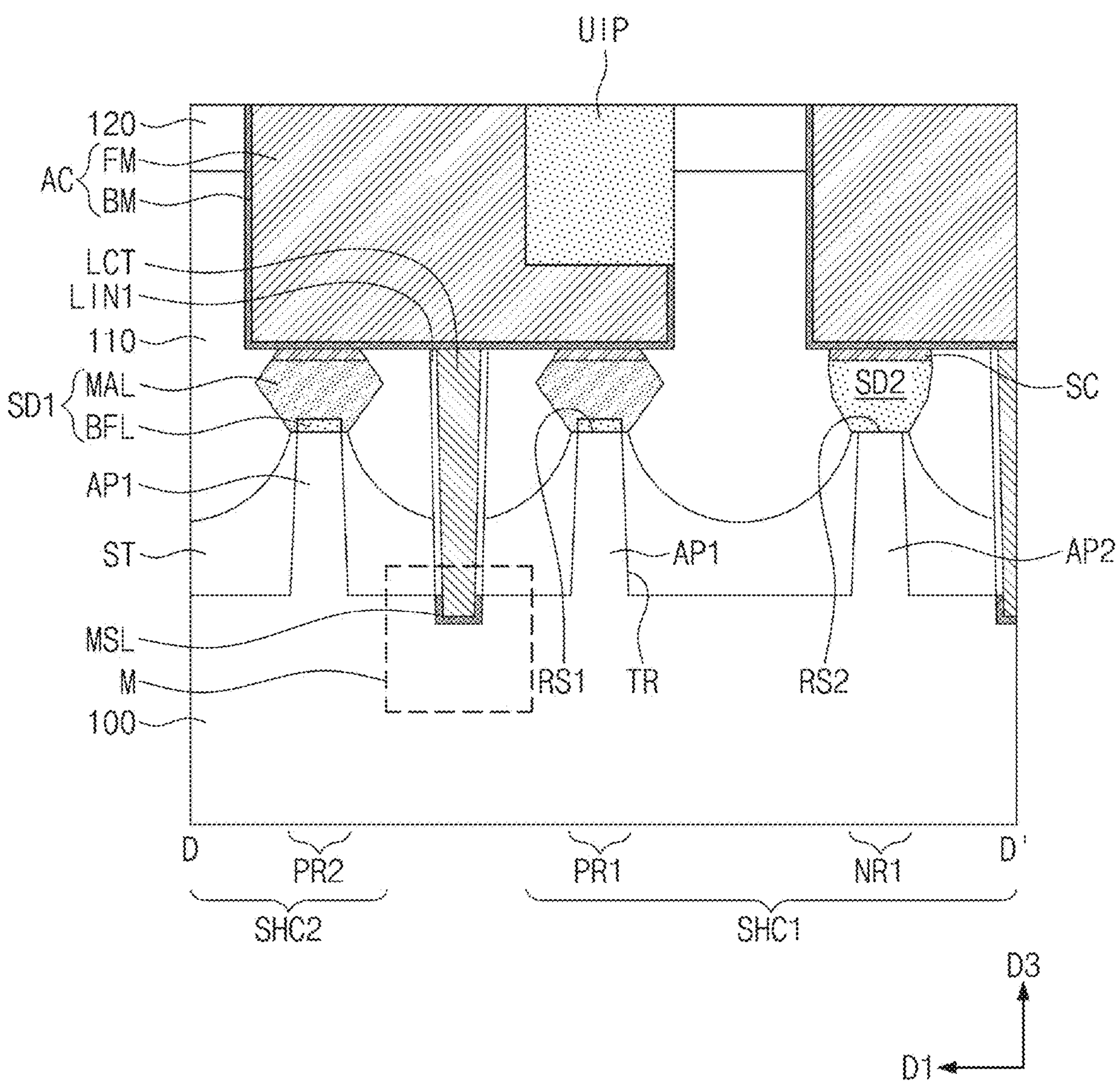
Figure 12D:
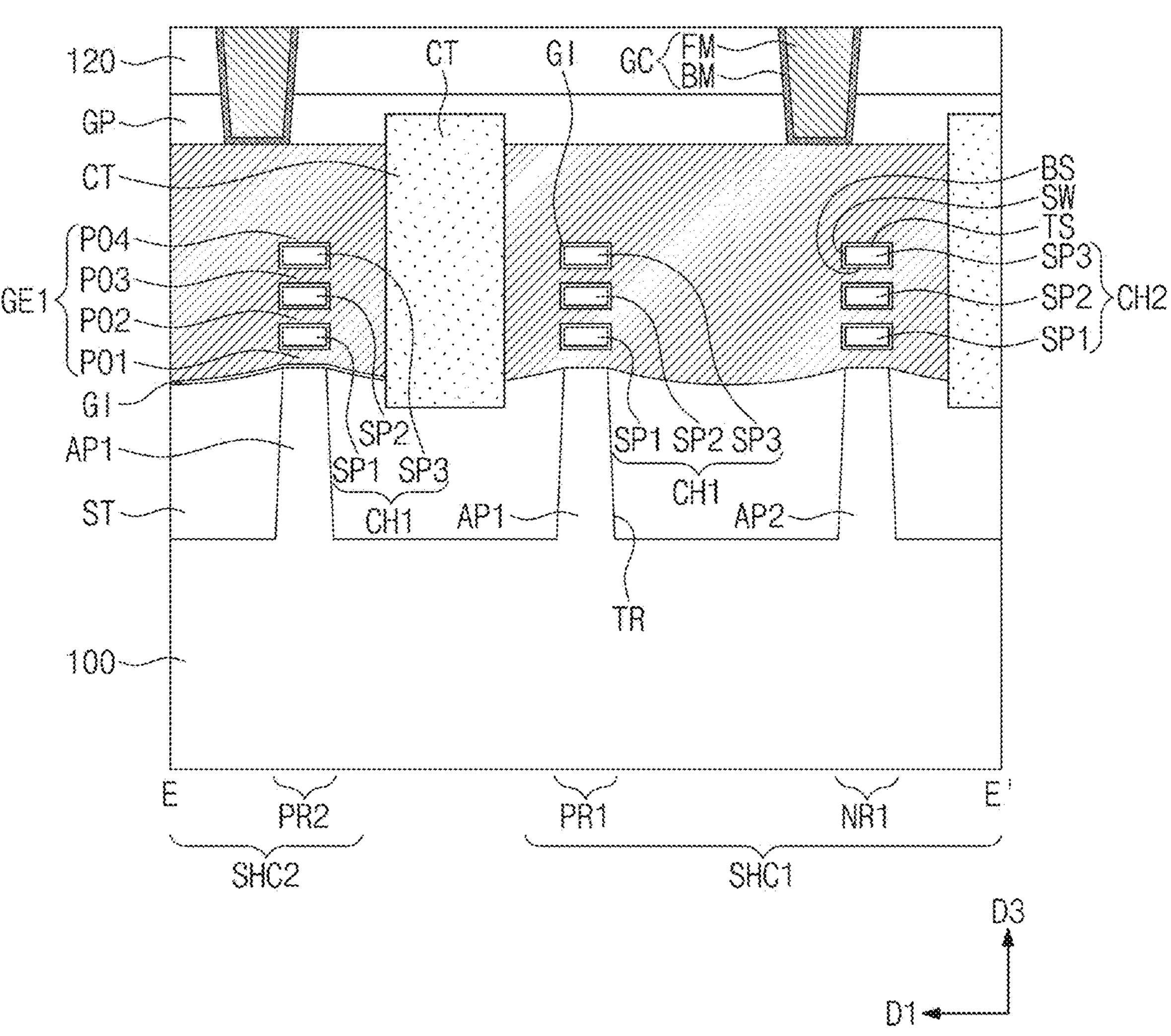

FIGS. 15 to 19 illustrate enlarged views showing a method of forming second M of FIG. 12C and section M of FIG. 14.

Figure 15:
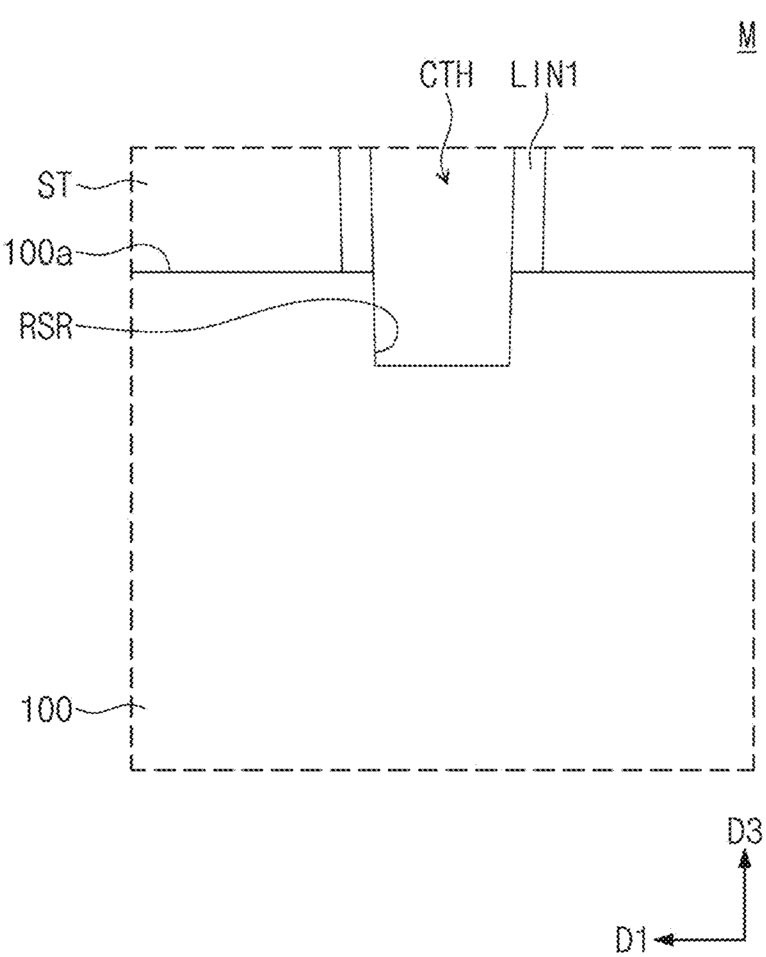
FIGS. 15 to 19 illustrate enlarged views showing a method of forming second M of FIG. 12C and section M of FIG. 14.

Referring to FIG. 15, a contact hole CTH may be formed to define a lower contact LCT. The contact hole CTH may be formed to expose a top surface 100*a* of the substrate 100. A first liner LIN1 may be conformally formed on a sidewall of the lower contact LCT. The formation of the first liner LIN1 may include forming a liner layer in the contact hole CTH and performing an anisotropic etching process on the liner layer.

The anisotropic etching process may over-etch the top surface 100*a* of the substrate 100 to form a recess region RSR. The recess region RSR may have a bottom surface lower than the top surface 100*a* of the substrate 100.

Figure 16:
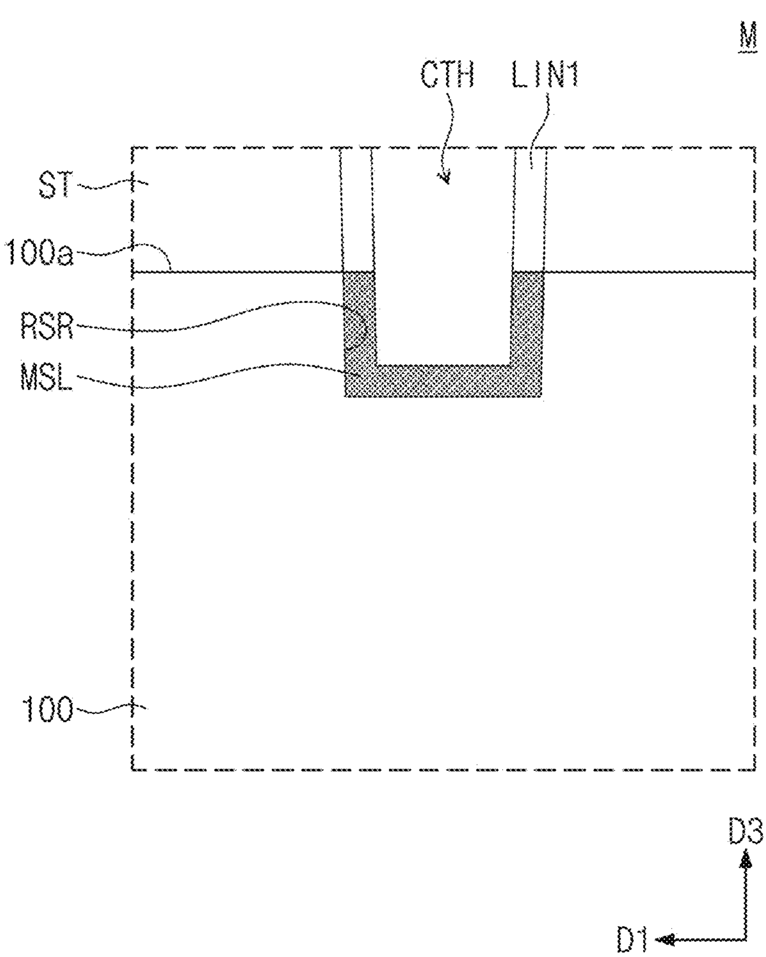

Referring to FIG. 16, a conductive layer MSL may be formed in the recess region RSR. The conductive layer MSL may be formed by a deposition process or an epitaxial growth process using a first element ME1. For example, the first element ME1 may include at least one selected from titanium (Ti), molybdenum (Mo), and germanium (Ge).

In an embodiment of inventive concepts, the conductive layer MSL may be formed by a deposition process that uses a transistor metal such as titanium (Ti) and/or molybdenum (Mo). In this case, the transition metal of the conductive layer MSL and silicon (Si) of the substrate 100 may react with each other to form a metal-silicide layer. For example, the conductive layer MSL may include a metal-silicide layer.

In another embodiment of inventive concepts, the conductive layer MSL may be formed by an epitaxial growth process that uses a metalloid such as germanium (Ge). Therefore, it may be possible to form a semiconductor epitaxial layer including silicon-germanium (SiGe). For example, the conductive layer MSL may include a semiconductor epitaxial layer.

Figure 17:
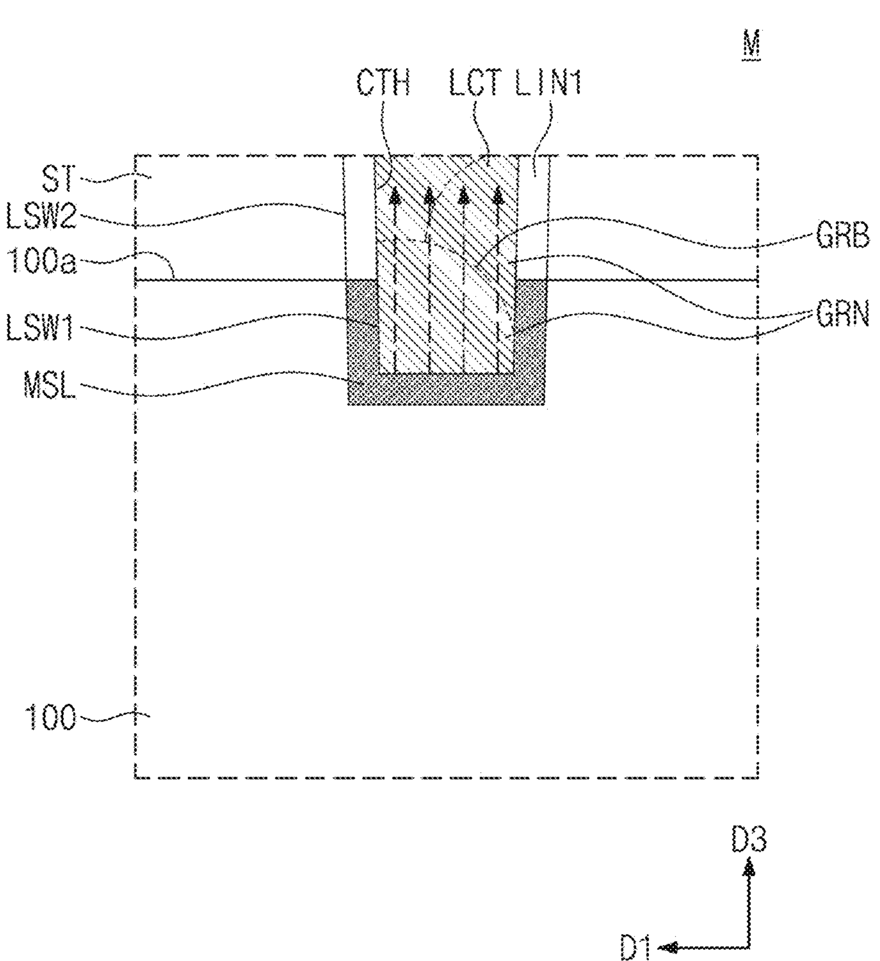

Referring to FIG. 17, a lower contact LCT may be formed in a bottom-up growth fashion in which the conductive layer MSL is served as a nucleation site. For example, metal may selectively grow along the third direction D3 from the conductive layer MSL to form the lower contact LCT. The lower contact LCT may be formed of a second element ME2 that is a transition metal. The second element ME2 may include at least one selected from molybdenum, tungsten, and ruthenium.

For example, a precursor including the second element ME2 may grow in a bottom-up fashion from the conductive layer MSL, or a metal layer or an epitaxial layer, that serves as a nucleation site. Therefore, a transition metal or the second element ME2 may not grow on the first liner LIN1, but may grow in the third direction D3 only from the conductive layer MSL.

The precursor may include MoCl. A deposition process using MoCl5 may be performed such that Mo may be deposited in a bottom-up growth fashion on the conductive layer MSL. As the lower contact LCT is formed in a bottom-up growth fashion, the lower contact LCT of inventive concepts may have a relatively large grain size, and may be limited and/or prevented from the formation of seam therein.

Figure 18:
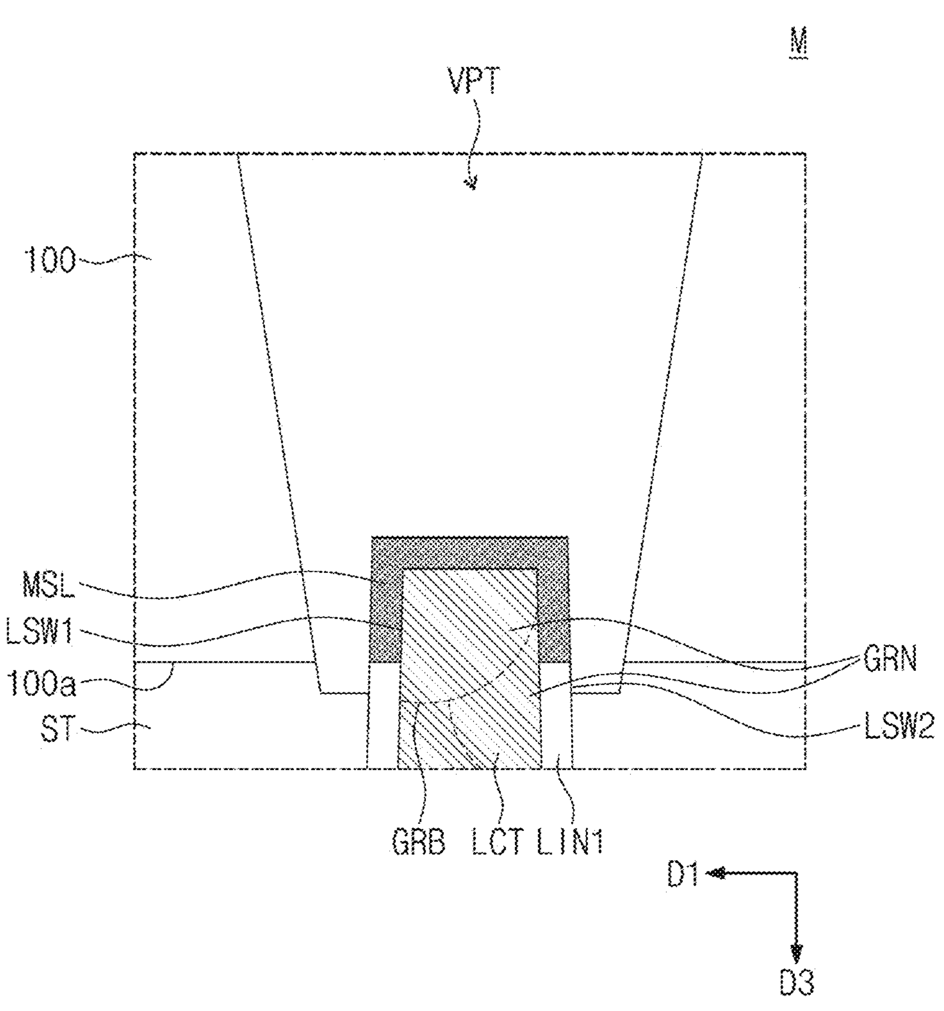

Referring to FIG. 18, as discussed above with reference to FIG. 13, the bottom surface 100*b* of the substrate 100 may undergo a planarization process to reduce a thickness of the substrate 100. The bottom surface 100*b* of the substrate 100 may undergo a patterning process to form a lower line trench VPT. The lower line trench VPT may extend in the second direction D2.

The lower line trench VPT may expose the conductive layer MSL and a second lower sidewall LSW2 of the first liner LIN1. The lower line trench VPT may have a bottom surface lower than the top surface 100*a* of the substrate 100.

Figure 19:
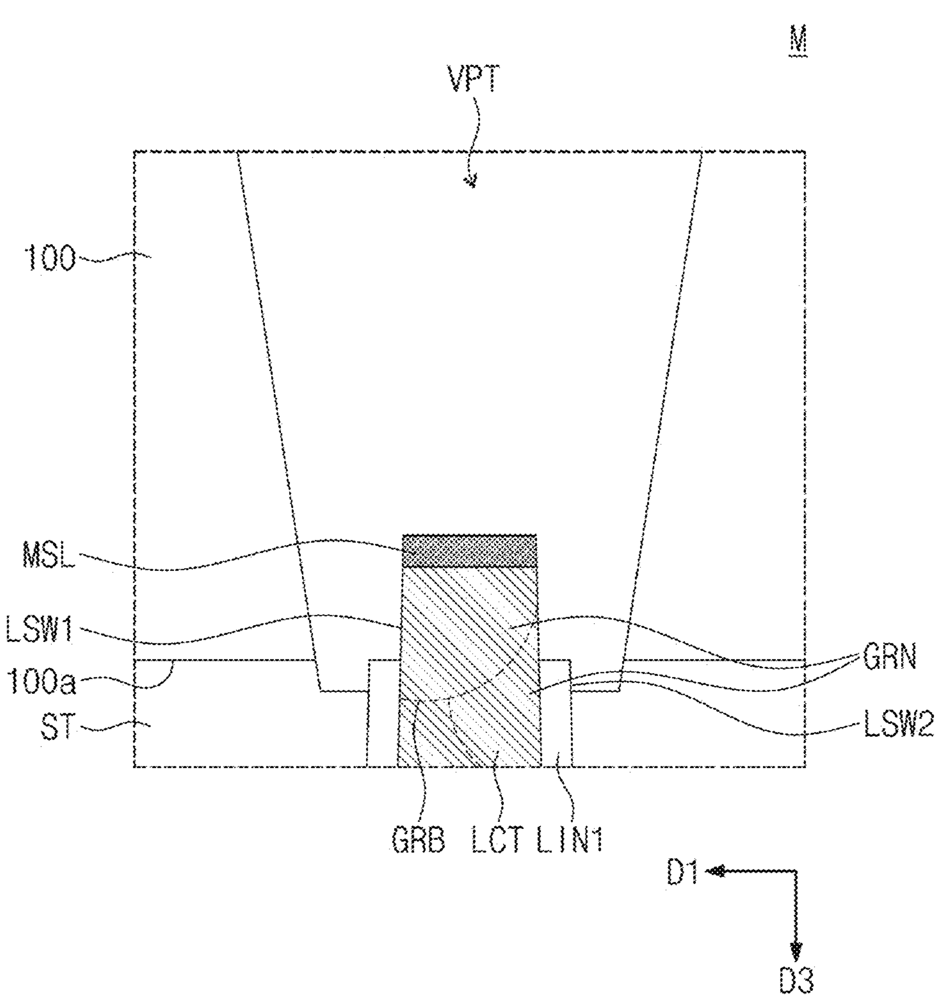

Referring to FIG. 19, the conductive layer MSL exposed by the lower line trench VPT may be selectively etched to expose a first lower sidewall LSW1 of the lower contact LCT. In another embodiment of inventive concepts, the conductive layer MSL may be completely removed.

Referring back to FIG. 6, the lower line trench VPT may be filled with metal to form a second lower power line VPR2. The second lower power line VPR2 may include a body part BDP having a linear shape that extends in the second direction D2 and a connection part CTP on the body part BDP. The connection part CTP may be in direct contact with the first lower sidewall LSW1 of the lower contact LCT and the second lower sidewall LSW2 of the first liner LIN1.

Figure 20:
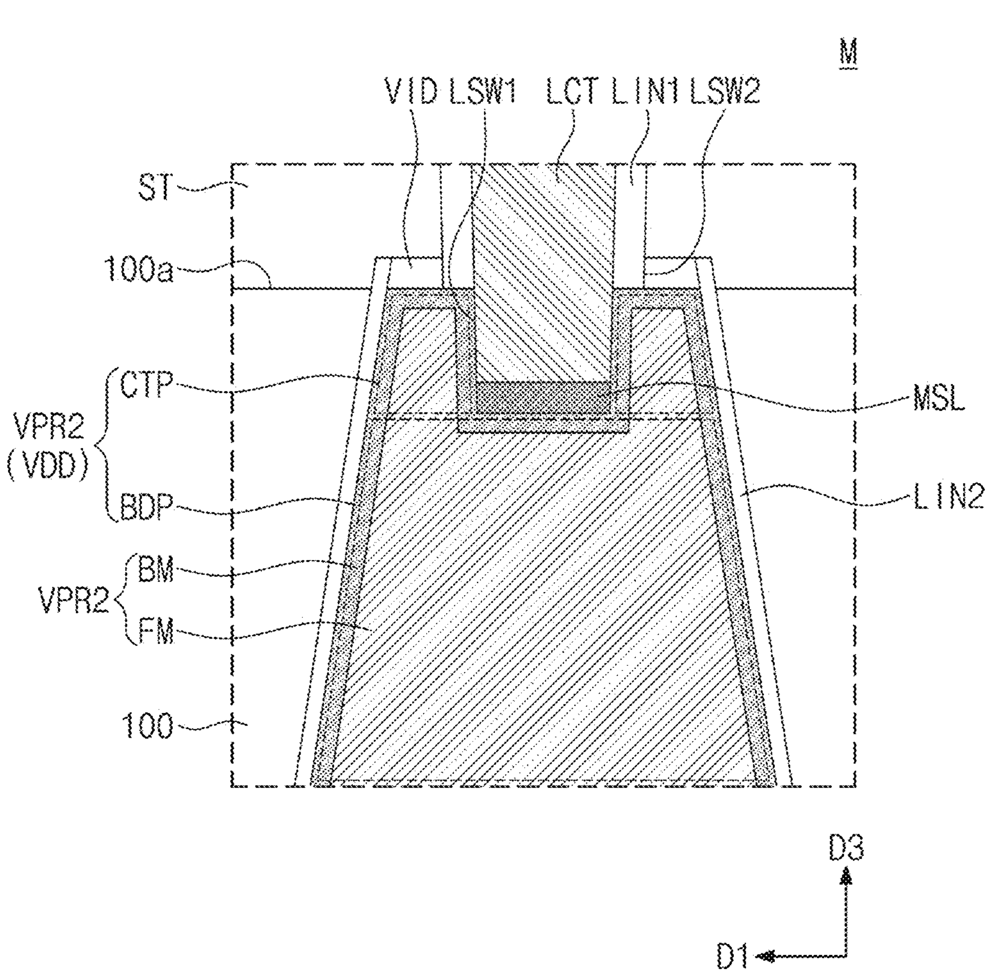
FIG. 20 illustrates an enlarged cross-sectional view of section M in FIG. 5D, showing a semiconductor device according to some embodiments of inventive concepts.

FIG. 20 illustrates an enlarged cross-sectional view of section M in FIG. 5D, showing a semiconductor device according to some embodiments of inventive concepts. In the embodiment that follows, a detailed description of technical features repetitive to those discussed above with reference to FIGS. 4 to 6 will be omitted, and a difference thereof will be explained in detail.

Referring to FIG. 20, a second liner LIN2 may be provided on a sidewall of the second lower power line VPR2. The second liner LIN2 may serve as a spacer of the second lower power line VPR2. The second liner LIN2 may separate the second lower power line VPR2 and the substrate 100 from each other. The second liner LIN2 may include a silicon-based dielectric material the same as or different from that of the first liner LIN1.

The second lower power line VPR2 may include a conductive pattern FM and a barrier pattern BM that surrounds the conductive pattern FM. The conductive pattern FM may include a metal layer, and the barrier pattern BM may include a metal nitride layer. The barrier pattern BM may be in direct contact with the lower contact LCT and the conductive layer MSL.

A void VID may be provided between the device isolation layer ST and the connection part CTP of the second lower power line VPR2. For example, the void VID may include air. The void VID may be surrounded by the second lower sidewall LSW2 of the first liner LIN1, the device isolation layer ST, the second liner LIN2, and the connection part CTP.

According to inventive concepts, a lower contact may be formed in a bottom-up growth fashion. It may thus be possible to limit and/or prevent a seam from being formed in the lower contact and to allow a grain of the lower contact to have a relatively large average size. The lower contact may have a reduced resistivity, and thus a semiconductor device according to inventive concepts may increase in reliability and electrical properties.

Although some embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed is:

1. A semiconductor device, comprising:

a substrate including an active pattern;

a source/drain pattern on the active pattern;

an active contact on the source/drain pattern;

a lower power line in the substrate;

a lower contact that vertically connects the active contact to the lower power line;

a conductive layer between the lower contact and the lower power line; and a power delivery network layer on a bottom surface of the substrate, wherein the conductive layer includes silicon (Si) and a first element, the first element includes a transition metal or a metalloid, and a concentration of the first element decreases in a direction from the lower contact toward the lower power line.

2. The semiconductor device of claim 1, wherein the lower power line includes a body part and a connection part, the connection part is connected to the lower contact, and the connection part surrounds a first lower sidewall of the lower contact.

3. The semiconductor device of claim 2, wherein the body part has a linear shape that extends in one direction.

4. The semiconductor device of claim 2, further comprising:

a liner on a sidewall of the lower contact, wherein the connection part is in contact with a lower sidewall of the liner.

5. The semiconductor device of claim 2, further comprising:

a device isolation layer on the substrate, wherein a part of the connection part and a part of the device isolation layer are spaced apart from each other to define a void between the part of the connection part and the part of the device isolation layer.

6. The semiconductor device of claim 1, wherein the lower contact includes a second element, the first element includes at least one of titanium (Ti), molybdenum (Mo), and germanium (Ge), and the second element includes at least one of molybdenum (Mo), tungsten (W), and ruthenium (Ru).

7. The semiconductor device of claim 1, wherein the conductive layer includes a metal-silicide layer or a semiconductor epitaxial layer.

8. The semiconductor device of claim 1, wherein a width of the lower contact decreases with decreasing distance from the bottom surface of the substrate, and a width of the lower power line increases with decreasing distance from the bottom surface of the substrate.

9. The semiconductor device of claim 1, wherein the lower contact includes grains and a grain boundary between the grains, and an average grain size of the grains is in a range of about 100 Å to about 500 Å.

10. The semiconductor device of claim 1, wherein the power delivery network layer is configured to apply a source voltage or a drain voltage to the lower power line.

11. A semiconductor device, comprising:

a substrate including an active pattern;

a source/drain pattern on the active pattern;

an active contact on the source/drain pattern;

a lower power line in the substrate;

a lower contact that vertically connects the active contact to the lower power line;

a conductive layer between the lower contact and the lower power line; and a power delivery network layer on a bottom surface of the substrate, wherein the conductive layer includes silicon (Si) and a first element, the first element includes a transition metal or a metalloid, a bottom surface of the lower contact is covered with the conductive layer, and a first lower sidewall of the lower contact is covered with the lower power line.

12. The semiconductor device of claim 11, wherein the lower contact includes a second element, the first element includes at least one of titanium (Ti), molybdenum (Mo), and germanium (Ge), and the second element includes at least one of molybdenum (Mo), tungsten (W), and ruthenium (Ru).

13. The semiconductor device of claim 11, further comprising:

a liner on a sidewall of the lower contact, wherein a lower sidewall of the liner is covered with the lower power line.

14. The semiconductor device of claim 11, wherein the conductive layer includes a metal-silicide layer or a semiconductor epitaxial layer.

15. The semiconductor device of claim 11, wherein the lower contact includes grains and a grain boundary between the grains, and an average grain size of the grains is in a range of about 100 Å to about 500 Å.

16. A semiconductor device, comprising:

a substrate including an active pattern;

a device isolation layer on the substrate, the device isolation layer defining the active pattern;

a channel pattern and a source/drain pattern on the active pattern;

a gate electrode on the channel pattern;

a gate dielectric layer between the gate electrode and the channel pattern;

a gate spacer on a sidewall of the gate electrode;

a gate capping pattern on a top surface of the gate electrode;

an interlayer dielectric layer on the source/drain pattern and the gate capping pattern;

an active contact penetrating the interlayer dielectric layer, the active contact being electrically connected to the source/drain pattern;

a metal-semiconductor compound layer between the active contact and the source/drain pattern;

a gate contact penetrating the interlayer dielectric layer and the gate capping pattern, the gate contact being electrically connected to the gate electrode;

a first metal layer on the interlayer dielectric layer, the first metal layer including a wiring line that is electrically connected to the gate contact;

a lower power line in the substrate;

a lower contact penetrating the device isolation layer and extending into the substrate, the lower contact vertically connecting the active contact to the lower power line; and a power delivery network layer on a bottom surface of the substrate, wherein the lower power line includes a body part and a connection part, the connection part is connected to the lower contact, and the connection part surrounds a first lower sidewall of the lower contact.

17. The semiconductor device of claim 16, wherein a region of the first lower sidewall of the lower contact is lower than a bottom surface of the device isolation layer.

18. The semiconductor device of claim 16, further comprising:

a liner on a sidewall of the lower contact, wherein the connection part is in contact with a lower sidewall of the liner.

19. The semiconductor device of claim 16, wherein a width of the lower contact decreases with decreasing distance from the bottom surface of the substrate, and a width of the lower power line increases with decreasing distance from the bottom surface of the substrate.

20. The semiconductor device of claim 16, wherein the lower contact includes grains and a grain boundary between the grains, and an average grain size of the grains is in a range of about 100 Å to about 500 Å.

* * * * *